(12) United States Patent
Ray et al.

(10) Patent No.: US 7,349,228 B1
(45) Date of Patent: Mar. 25, 2008

(54) EJECTOR ASSEMBLY FOR RACK-MOUNTED COMPUTING DEVICES

(75) Inventors: Brian J. Ray, Livermore, CA (US); William R. Jones, III, San Francisco, CA (US); Robert B. Brownell, Decatur, GA (US); Lawrence E. Davis, Atlanta, GA (US)

(73) Assignee: Extreme Networks, Santa Clara, CA (US)

( * ) Notice: Subject to any disclaimer, the term of this patent is extended or adjusted under 35 U.S.C. 154(b) by 0 days.

(21) Appl. No.: 10/722,692

(22) Filed: Nov. 24, 2003

(51) Int. Cl.
*H05K 7/14* (2006.01)
*H05K 7/18* (2006.01)

(52) U.S. Cl. .................. 361/801; 361/802; 361/798; 439/352

(58) Field of Classification Search .............. 361/732, 361/740, 747, 754, 755, 759, 798, 801; 398/117, 398/135; 439/352
See application file for complete search history.

(56) References Cited

U.S. PATENT DOCUMENTS

| | | | |
|---|---|---|---|
| 3,952,232 A | 4/1976 | Coules | |
| D261,354 S | 10/1981 | Clemens | |
| 4,345,809 A | 8/1982 | Sugden | |
| 4,603,375 A | 7/1986 | Miller et al. | |
| 5,140,501 A * | 8/1992 | Takahashi et al. | 361/798 |
| 5,352,441 A | 10/1994 | Koradia et al. | |
| 5,504,656 A * | 4/1996 | Joist | 361/754 |
| 5,629,836 A * | 5/1997 | Wright | 361/755 |
| 5,708,742 A | 1/1998 | Beun et al. | |
| 5,793,614 A * | 8/1998 | Tollbom | 361/732 |
| 5,978,233 A | 11/1999 | Roscoe et al. | |
| 6,095,851 A | 8/2000 | Laity et al. | |
| 6,128,198 A * | 10/2000 | Kurrer et al. | 361/759 |
| 6,148,506 A * | 11/2000 | Vermette | 29/758 |
| 6,172,880 B1 * | 1/2001 | Petitpierre et al. | 361/801 |
| 6,190,188 B1 | 2/2001 | Koradia et al. | |
| 6,250,938 B1 | 6/2001 | Tung | |
| 6,285,548 B1 | 9/2001 | Hamlet et al. | |
| 6,388,884 B1 | 5/2002 | Greco et al. | |
| 6,396,704 B1 | 5/2002 | White | |
| 6,406,312 B1 | 6/2002 | Heitkamp | |
| 6,407,933 B1 | 6/2002 | Bolognia et al. | |
| 6,496,379 B2 | 12/2002 | Pols Sandhu et al. | |
| 6,597,584 B1 | 7/2003 | Ray et al. | |
| 6,915,562 B2 * | 7/2005 | Joist | 29/758 |
| 2003/0039100 A1 | 2/2003 | Salinas | |

OTHER PUBLICATIONS

"cPCI Ejector Handle Specification," Purcell Bracket, Inc., available at: <purcellbrackets.com/images/home/ejectorhandlespecification.pdf>, 1 page, retrieved from WWW on Nov. 18, 2003.

* cited by examiner

*Primary Examiner*—Tuan T. Dinh
*Assistant Examiner*—Hung S Bui
(74) *Attorney, Agent, or Firm*—Blakely Sokoloff Taylor & Zafman

(57) ABSTRACT

An ejector assembly for securing a blade in a rack and for ejecting the blade from the rack. The ejector assembly includes an ejector handle movable between a first position wherein the blade is secured in the rack and a second position wherein the blade can be removed from the rack. The ejector assembly also includes a release mechanism to hold the ejector handle in the first position. Upon actuation of the release mechanism, the ejector handle may be moved toward the second position. The ejector assembly may further include a lock mechanism to prevent actuation of the release mechanism.

52 Claims, 15 Drawing Sheets

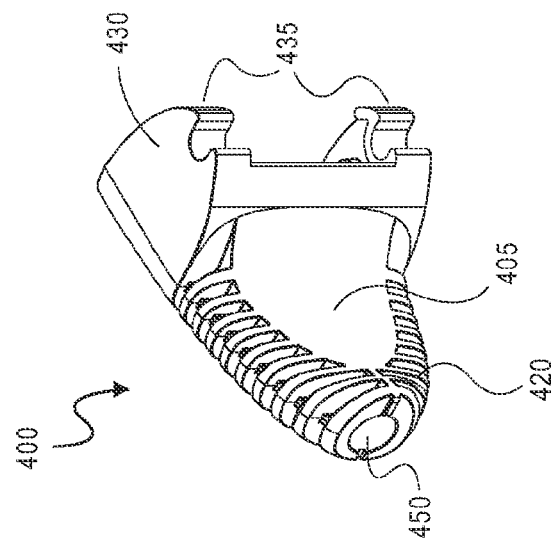
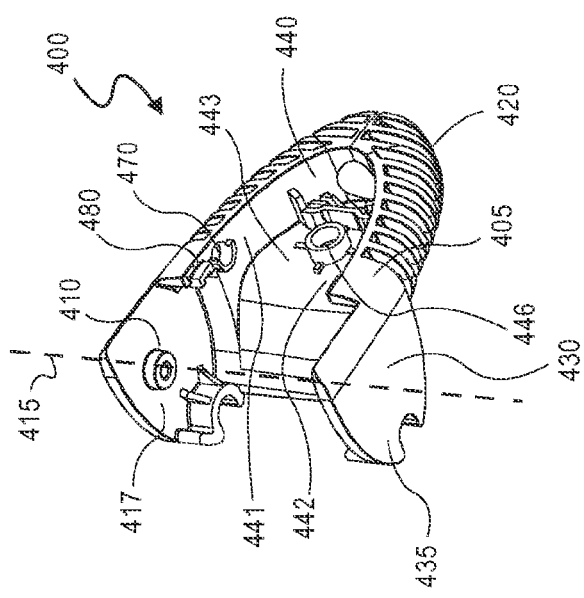
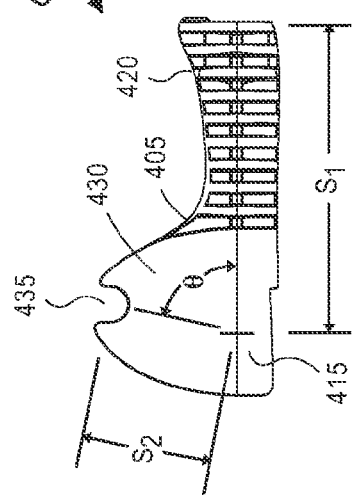

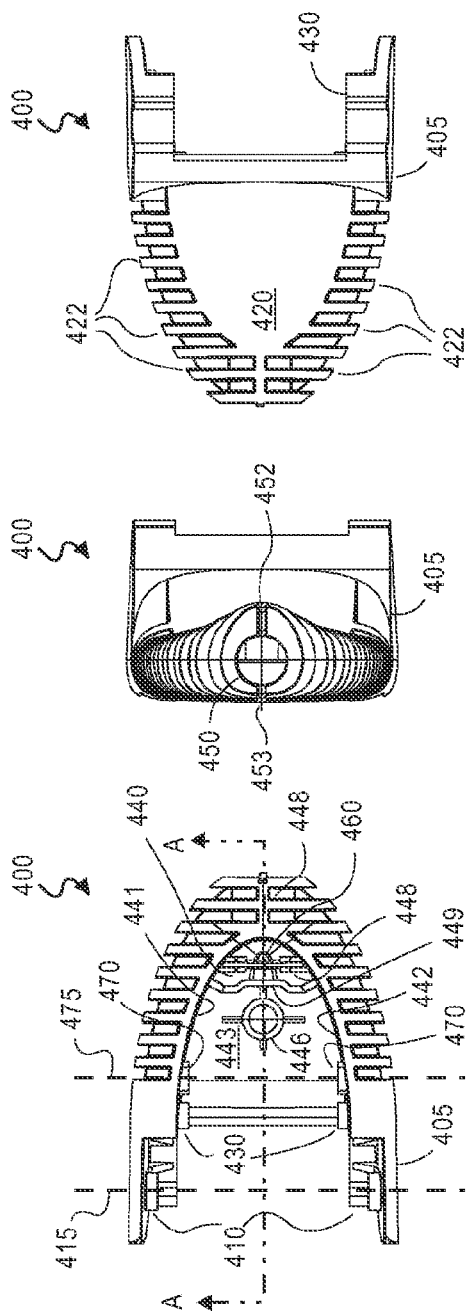
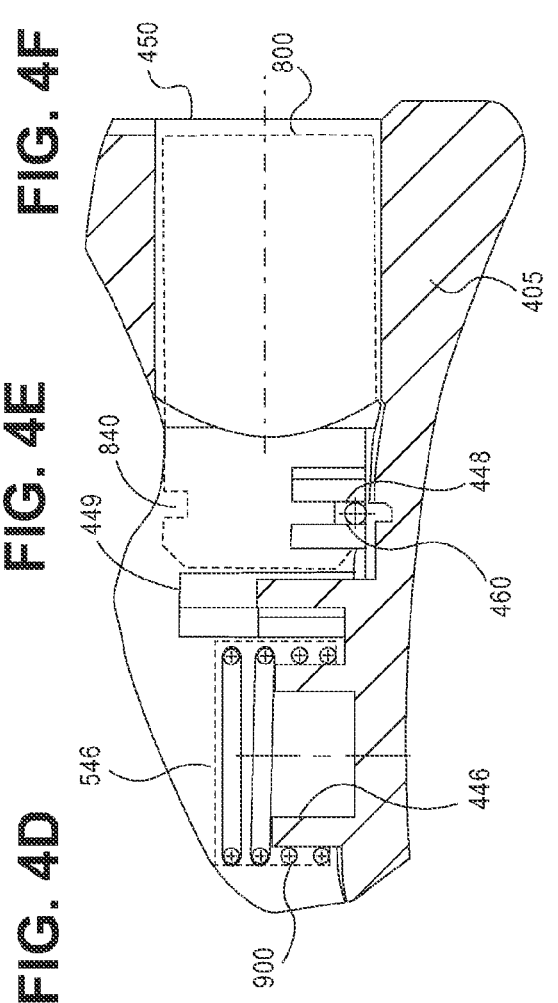
FIG. 4F
FIG. 4E
FIG. 4G
FIG. 4D

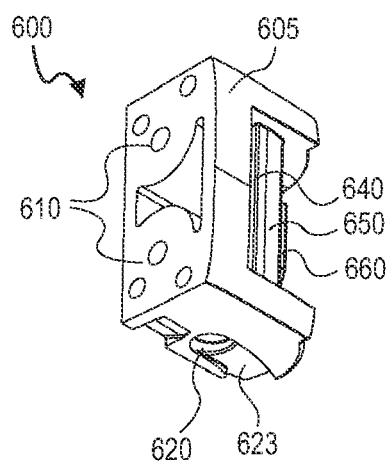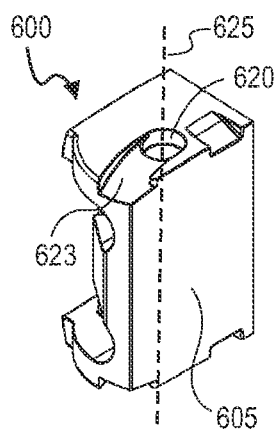
FIG. 6A  FIG. 6B
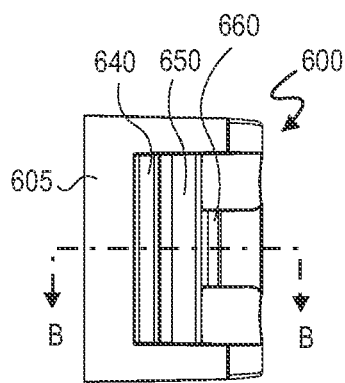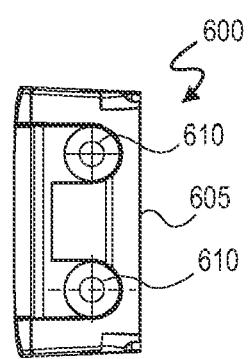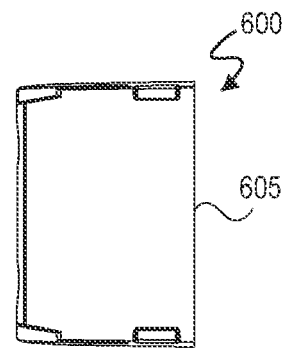
FIG. 6D  FIG. 6E  FIG. 6F
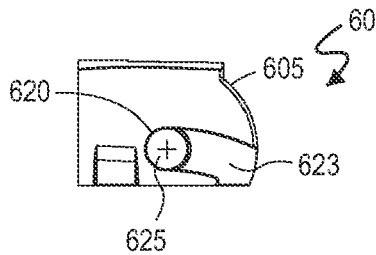
FIG. 6C
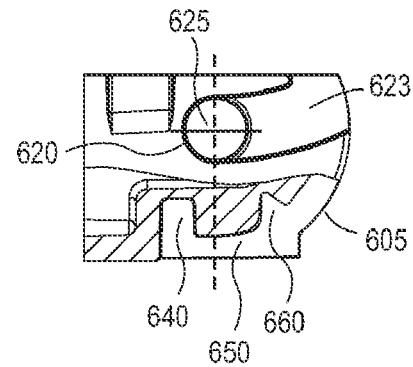
FIG. 6G

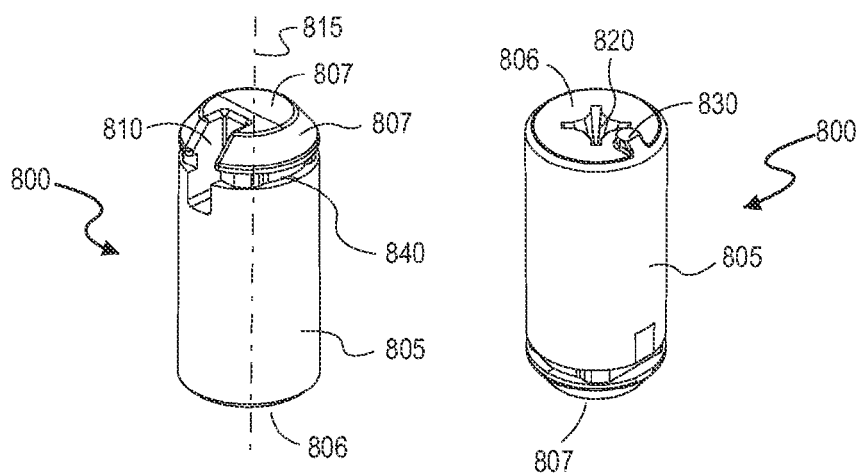
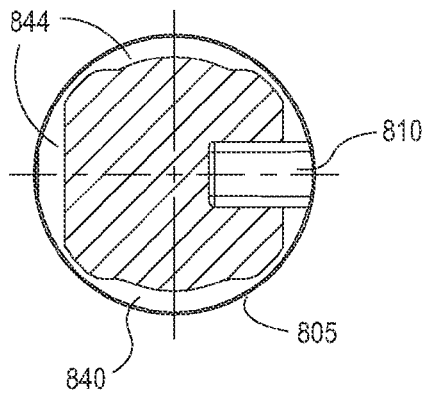
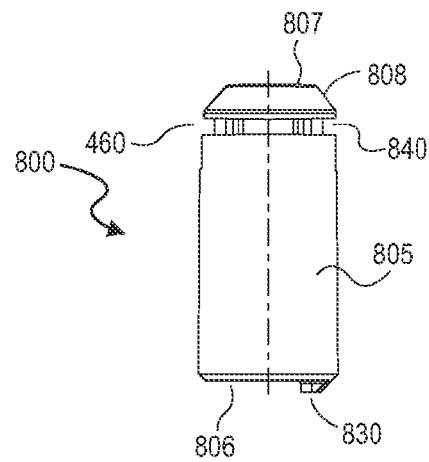
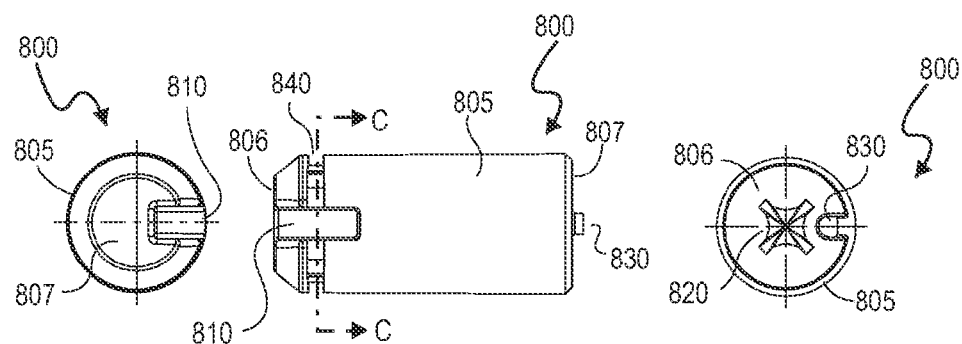

EJECTOR ASSEMBLY FOR RACK-MOUNTED COMPUTING DEVICES

FIELD OF THE INVENTION

The invention relates generally to rack mounted computing devices and, more particularly, to an ejector assembly for securing a device within a rack and for ejecting the device from the rack.

BACKGROUND OF THE INVENTION

For some computing applications, such as computer networking and telecommunications, it is often necessary to store a large number of computing devices (e.g., switches, routers, servers, etc.) in a relatively small area. To facilitate such a high component density, a number of the computing devices are typically mounted together in a "rack." A rack may also be referred to as a "chassis" or "cage," and a variety of such rack mounted installations are known in the art.

An example of a conventional rack 100 is illustrated in FIG. 1. The rack 100 comprises a rectangular-shaped housing 110 having an interior cavity 120 capable of receiving a number of individual computing devices 200, including devices 200a, 200b, ..., 200f. Each of the devices 200a-f may comprise any type of computing system or device, such as a switch, router, server, etc. Note that one or more of the devices (e.g., devices 200e, 200f) may comprise controller units for the rack mounted installation. The devices 200 may also be referred to as "blades", "circuit boards", or simply "boards." Generally, the term "blade" will be used herein to refer to a computing device that can be received in a rack mounted installation, such as the rack 100 shown in FIG. 1.

The interior cavity 120 of rack 100 is partitioned into a number of bays 130, including bays 130a, 130b, ..., 130j. Each of the bays 130a-j is capable of receiving a single blade 200 (e.g., blade 200a is disposed in bay 130a, blade 200b is disposed in bay 130b, and so on, but note that bays 1301, 130j are shown empty). The rack 100 usually includes a number of spaced-apart guides 135 for slidably receiving and guiding each received device 200 into its corresponding bay 130. Generally, each blade 200 is inserted into the interior cavity 120 through an open front face 125 of the rack. Various sizes and configurations of racks have been produced, some orienting the blades 200 vertical (as shown in FIG. 1), while others orient the blades horizontal. Also, the rack 100 may include additional devices mounted therein—e.g., power supplies, fans, etc.—that are not shown in FIG. 1 for ease of illustration.

Referring to FIG. 2A, illustrated is one embodiment of a conventional blade 200. The blade 200 includes a board 210 (e.g., a circuit board) or other suitable substrate. Disposed on the board 210 is a number of components 215 (e.g., processing devices, memory devices, and other integrated circuit components, as well as discrete devices such as capacitors, etc.). Attached to the board 210 (or formed integral therewith) is a front panel 220, wherein the front panel is typically mounted at a right angle with respect to board 210. When the blade 200 is inserted into rack 100, a front face 225 of the front panel 220 will be visible and physically accessible from the front face 125 of rack 100. A number of connectors 230 (e.g., electrical or optical connectors) and status indicators 235 (e.g., light emitting diodes, liquid crystal displays, etc.), as well as other components (e.g., keypads, buttons, and other input devices), may be mounted on the front panel 220. Together, the components 215 on board 210, as well as the components mounted on the front panel 220 (e.g., connectors 230 and/or status indicators 235, etc.), comprise a computing system, such as a switch, router, server, or other system.

Although illustrated in FIG. 2A as a board 210 and an attached front panel 220, it should be understood that the blade 200 may comprise a housing. By way of example, as shown in the embodiment of FIG. 2B, a blade 200 may comprise a rectangular housing 205 having the board 210 disposed therein (or having the board forming a wall of the housing), wherein the connectors 230 and status indicators 235 are disposed on a front panel 220 of the housing.

The rack 100 will usually provides a common back-plane (not shown in the figures) to which each of the blades 200 can be connected, thereby allowing each device to communicate with components outside the rack as well as enabling communication between the blades in that rack. To couple a blade 200 to the back-plane, the blade includes one or more connectors 240 (as shown in each of FIGS. 2A and 2B) capable of being connected with (e.g., plugged into) a mating receptacle (or receptacles) disposed on the rack 100. Generally, the mating receptacle (not shown in figures) on the rack 100 is mounted at the rear of the rack's interior cavity 120, and when a blade 200 is inserted into a bay 130 of the rack, the insertion force causes the connector 240 on the blade to plug into the mating receptacle on the rack. The connection between the mating connector 240 and receptacle often provides a significant retraction force, this high interconnect force generally being a by-product of the need for a good electrical connection. The retraction forces may prevent unintentional withdrawal of the connector from the receptacle and, therefore, these forces can inhibit outward movement of the blade 200 itself relative to the rack 100. These retraction forces can be sufficiently high to make ejection of a blade from the rack difficult.

To ease ejection of a blade 200 from the rack 100, the blade 200 may include one or more ejectors 250, as shown in each of FIGS. 2A and 2B. The ejectors 250 may be mounted on the front panel 220 and usually there are two ejectors, one on each side of the front panel. An ejector 250 comprises a device—e.g., a lever or other mechanism providing a mechanical advantage—that can overcome the retraction force of the mating connector 240 and receptacle and, accordingly, that can be used to facilitate ejection of the blade 200 from its corresponding bay 130 of the rack 100. A typical ejector comprises a simple lever having a handle that, when actuated, forces the blade out of the rack (again, by a mechanical advantage obtained by, in this example, the lever). However, these conventional ejectors provide little, if any, additional functionality.

SUMMARY OF THE INVENTION

In one embodiment, an ejector comprises an ejector handle that is capable of being rotationally coupled with a blade and that is movable between a first position and a second position. When the ejector handle is in the first position, the blade is secured in a rack, and when the ejector handle is in the second position, the blade can be removed from the rack. The ejector also includes a release mechanism coupled with the ejector handle. The release mechanism can secure the ejector handle in the first position and, upon actuation, the release mechanism allows movement of the ejector handle toward the second position. The ejector further comprises a lock mechanism disposed in the ejector handle and movable between a locked position and an unlocked position. When the lock mechanism is in the locked position, the lock mechanism engages the release mechanism to prevent actuation of the release mechanism.

In another embodiment, an apparatus comprises a blade that can be disposed in a rack. Coupled with the blade is an ejector assembly. The ejector assembly comprises an ejector handle rotationally coupled with the blade and that is movable between a first position and a second position. When the ejector handle is in the first position, the blade is secured in the rack, and when the ejector handle is in the second position, the blade can be removed from the rack. The ejector also includes a release mechanism coupled with the ejector handle. The release mechanism can secure the ejector handle in the first position and, upon actuation, the release mechanism allows movement of the ejector handle toward the second position. The ejector further comprises a lock mechanism disposed in the ejector handle and movable between a locked position and an unlocked position. When the lock mechanism is in the locked position, the lock mechanism engages the release mechanism to prevent actuation of the release mechanism.

In a further embodiment, an ejector comprises means for ejecting a blade from a rack. The ejecting means is movable between a first position wherein the blade is secured in the rack and a second position wherein the ejector handle can be removed from the rack. The ejector also comprises means for releasing the ejecting means. The releasing means can secure the ejecting means in the first position and, upon actuation, allows movement of the ejecting means toward the second position. The ejector further comprises a means for locking the releasing means. The locking means is movable between and locked position and an unlocked position, wherein the locking means prevents actuation of the release mechanism when in the locked position.

In yet another embodiment, a method comprises inserting a blade into a rack using an ejector handle that is coupled with the blade, wherein the blade is inserted into the rack by moving the ejector handle from a second position to a first position. The method also includes holding the ejector handle at the first position with a release mechanism, with the release mechanism at an initial position. The method further comprises actuating a lock mechanism to lock the release mechanism at the initial position.

BRIEF DESCRIPTION OF THE DRAWINGS

FIGS. 4A-4B are perspective views of one embodiment of an ejector handle, which may comprise part of the ejector assembly of FIG. 3.

FIG. 4C is a top elevation view of the ejector handle shown in FIGS. 4A-4B.

FIG. 4D is a front elevation view of the ejector handle shown in FIGS. 4A-4B.

FIG. 4E is a side elevation view of the ejector handle shown in FIGS. 4A-4B.

FIG. 4F is a rear elevation view of the ejector handle shown in FIGS. 4A-4B.

FIG. 4G is a partial, enlarged cross-sectional view of the ejector handle, as taken along line A-A of FIG. 4D.

FIGS. 6A-6B are perspective views of one embodiment of a base, which may comprise part of the ejector assembly of FIG. 3.

FIG. 6C is a bottom elevation view of the base of FIGS. 6A-6B.

FIG. 6D is a front elevation view of the base of FIGS. 6A-6B.

FIG. 6E is a side elevation view of the base of FIGS. 6A-6B.

FIG. 6F is a rear elevation view of the base of FIGS. 6A-6B.

FIG. 6G is an enlarged cross-sectional view of the base of FIGS. 6A-6B, as taken along line B-B of FIG. 6D.

FIGS. 8A-8B are perspective views of one embodiment of a lock mechanism, which may comprise part of the ejector assembly of FIG. 3.

FIG. 8C is one elevation view of the lock mechanism of FIGS. 8A-8B.

FIG. 8D is a top elevation view of the lock mechanism of FIGS. 8A-8B.

FIG. 8E is another elevation view of the lock mechanism of FIGS. 8A-8B.

FIG. 8F is a bottom elevation view of the lock mechanism of FIGS. 8A-8B.

FIG. 8G is an enlarged cross-sectional view of the lock mechanism of FIG. 8A-8B, as taken along line C-C of FIG. 8E.

DETAILED DESCRIPTION OF THE INVENTION

Described below are various embodiments of an ejector assembly that may be used to secure a blade within—and to eject the blade from—a rack installation. The disclosed embodiments of the ejector assembly may find use with any type of blade (e.g., the blade 200 in either of FIGS. 2A and 2B) that is being inserted into any type of rack (e.g., the rack 100 of FIG. 1 or other rack configuration). It should be understood, however, that although the disclosed embodiments are described below in the context of a rack mounted installation comprising one or more blades secured within a rack, the disclosed embodiments may find application with any type of device being secured within any type of enclosure or other support structure.

Figure 2A:
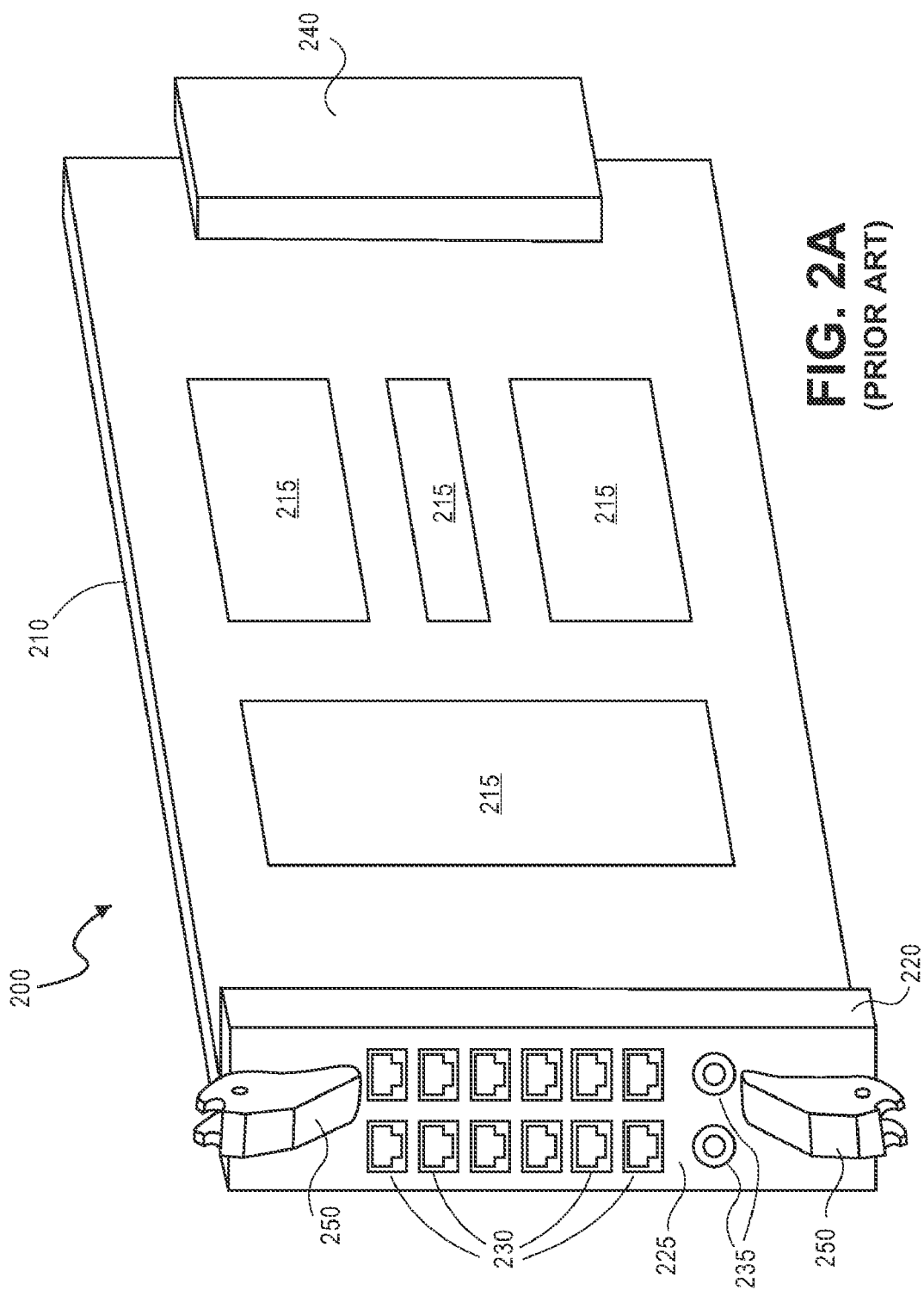
FIG. 2A is a perspective view of one embodiment of a conventional blade, as may be disposed in the rack of FIG. 1.
Figure 2B:
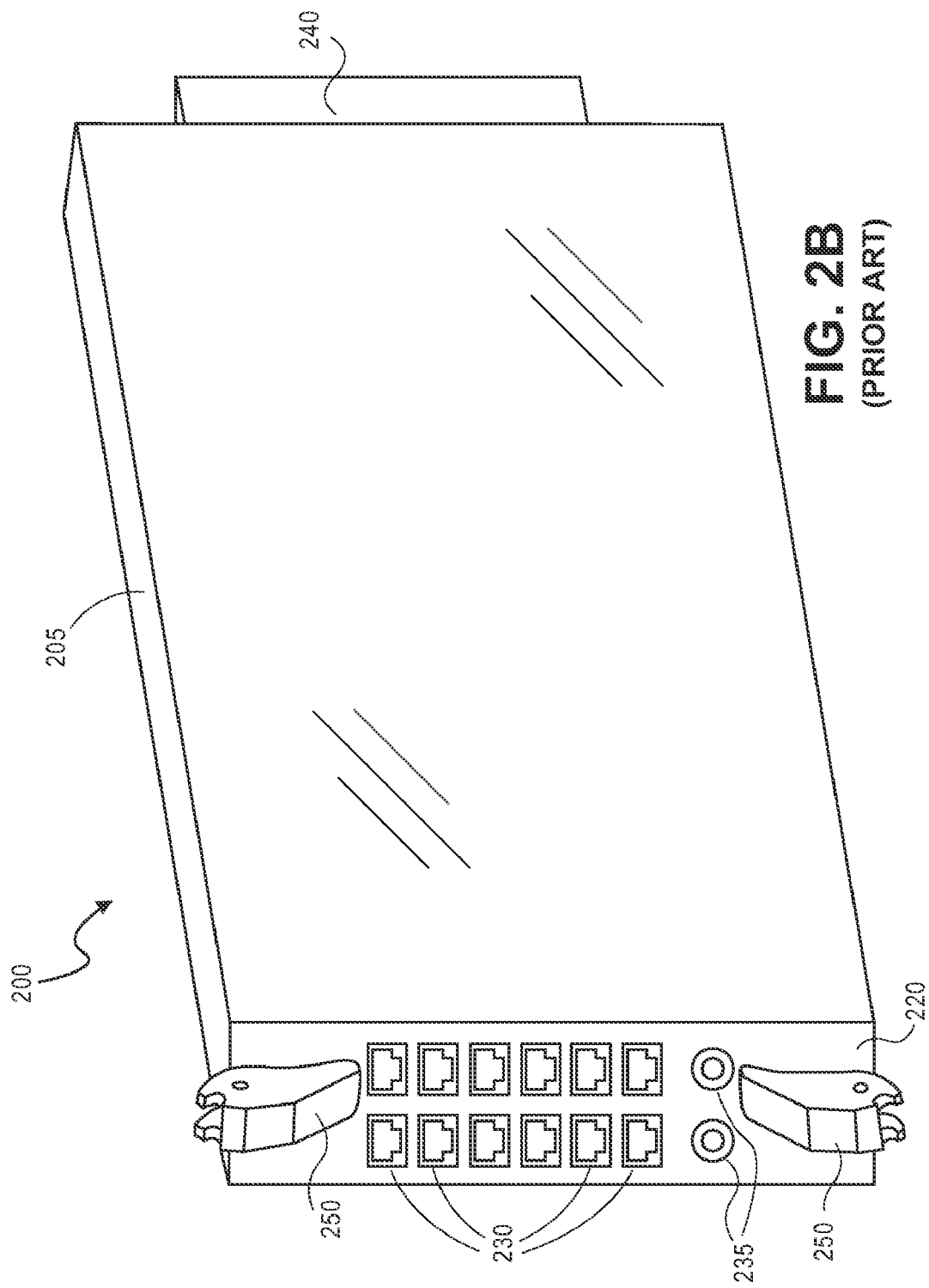
FIG. 2B is a perspective view of another embodiment of a conventional blade, as may be disposed in the rack of FIG. 1.
Figure 3:
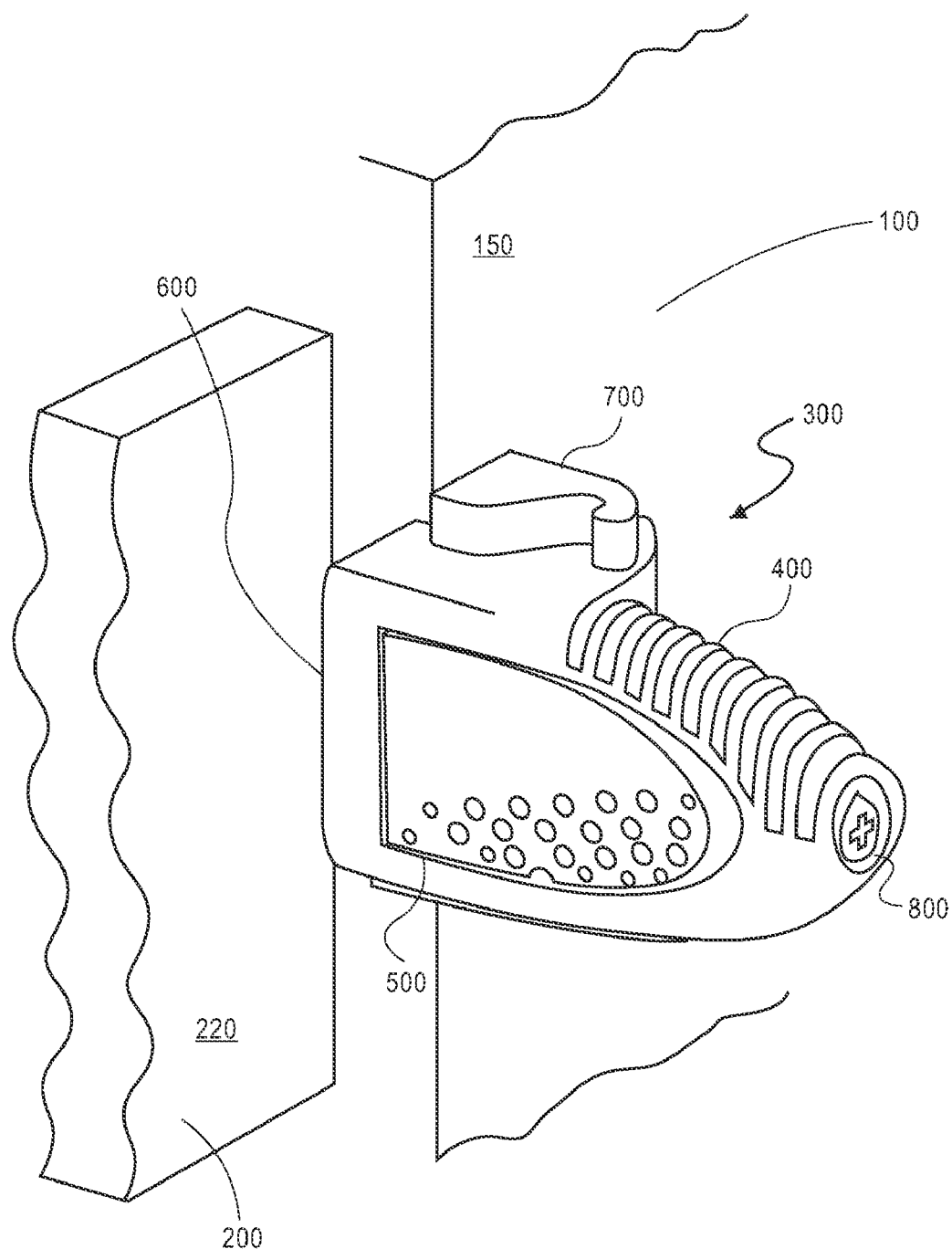
FIG. 3 is a perspective view of one embodiment of an ejector assembly.
Figures 5A, 5B:
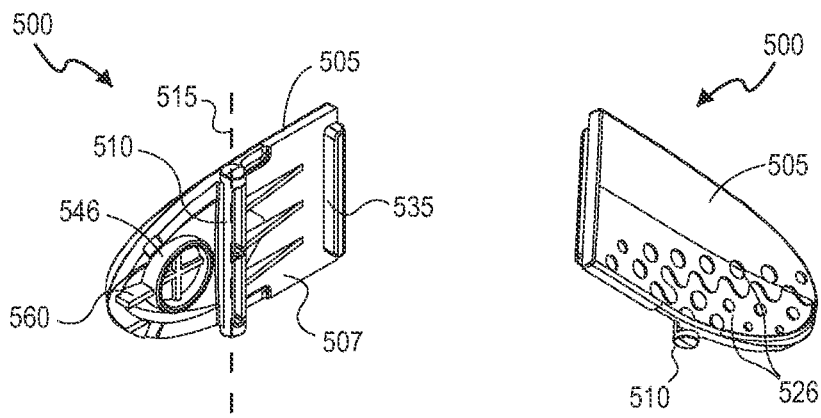
FIGS. 5A-5B are perspective views of one embodiment of a release mechanism, which may comprise part of the ejector assembly of FIG. 3.
Figure 5C:
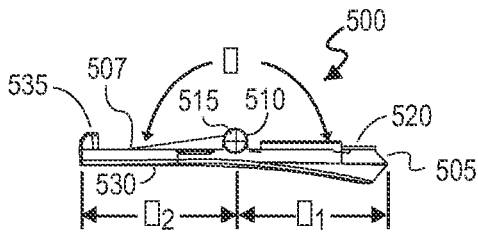
FIG. 5C is a top elevation view of the release mechanism of FIGS. 5A-5B.
Figures 5D, 5E:
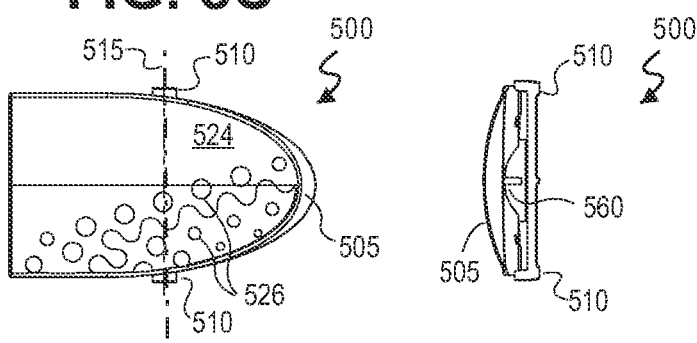
FIG. 5D is a front elevation view of the release mechanism of FIGS. 5A-5B.
FIG. 5E is a side elevation view of the release mechanism of FIGS. 5A-5B.
Figure 5F:
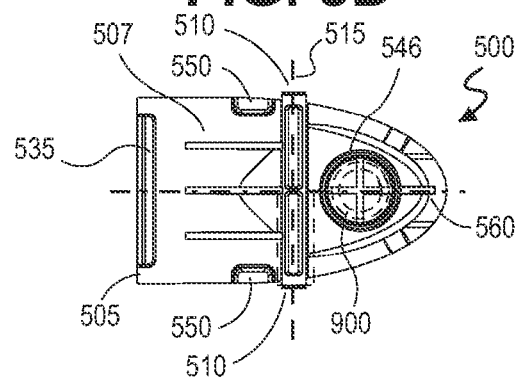
FIG. 5F is a rear elevation view of the release mechanism of FIGS. 5A-5B.
Figures 7A, 7B:
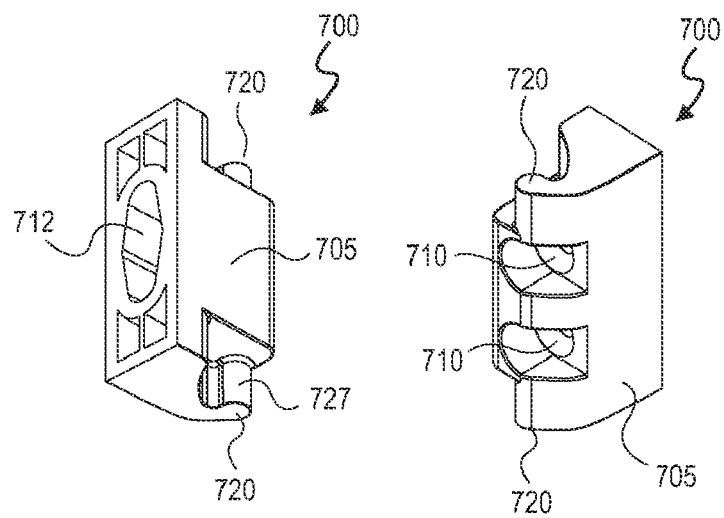
FIGS. 7A-7B are perspective views of one embodiment of a hook, which may comprise part of the ejector assembly of FIG. 3.
Figure 7C:
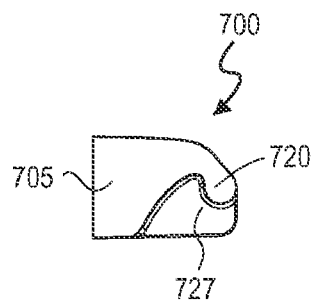
FIG. 7C is a top elevation view of the hook of FIGS. 7A-7B.
Figures 7D, 7E:
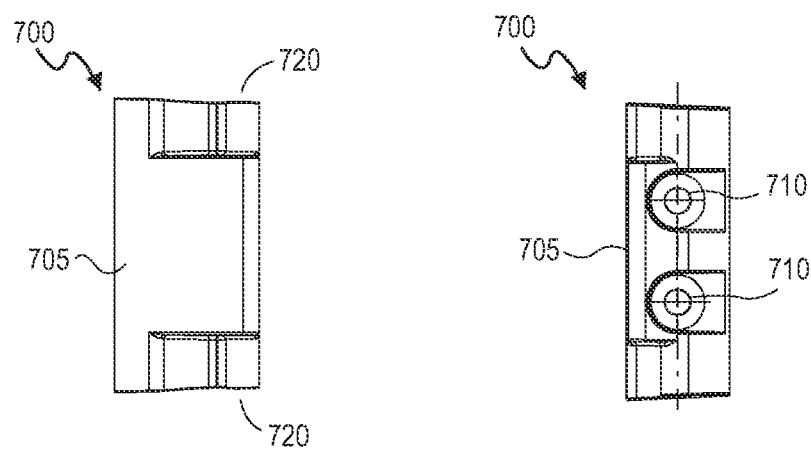
FIG. 7D is a front elevation view of the hook of FIGS. 7A-7B.
FIG. 7E is a side elevation view of the hook of FIGS. 7A-7B.

Illustrated in FIG. 3 is one embodiment of an ejector assembly 300. The ejector assembly 300 comprises an ejector handle 400 that is coupled with a base 600. Disposed on the ejector handle 400 is a release mechanism 500. The base 600 is attached to the front panel 220 of a blade 200 (e.g., the blade shown in either FIG. 2A or 2B). Attached to the rack 100—e.g., to a front surface 150 (see FIG. 1)—is a hook 700. The ejector assembly 300 also includes a lock mechanism 800. Although a single ejector assembly 300 is shown in FIG. 3, it should be understood that, for example, two such ejector assemblies (one on each end of the front panel 220) may be disposed on the blade 200. Each of the ejector handle 400, release mechanism 500, base 600, hook 700, and lock mechanism 800, as well as operation of the ejector assembly 300, will now be described in greater detail.

The ejector handle 400 comprises any device or mechanism that is capable of exerting an insertion force on the blade 200 during installation of the blade in the rack 100 and, further, that is capable of exerting an extraction force on the blade 200 to pull the blade out of the rack during removal. The insertion and extraction forces should, in one embodiment, be sufficient to overcome any opposing force generated by the interaction between the blade's connector 240 and its mating receptacle on the rack (during either insertion or removal). In a further embodiment, the ejector handle 400 comprises a device or mechanism that is capable of providing a mechanical advantage to enhance the insertion and retraction forces provided by the ejector assembly 300.

Referring to FIGS. 4A-4G, one embodiment of the ejector handle 400 is illustrated. The ejector handle 400 comprises a body 405 including journal elements 410 disposed on an axis of rotation 415. The journal elements 410 are used to rotationally coupled the ejector handle 400 to the base 600, as will be explained more fully below. In one embodiment, as shown in FIGS. 4A-4G, the journal elements 410 comprise cylindrical protrusions, each extending from an interior surface 417 of the ejector handle. In a further embodiment, each of the journal elements 410 is formed integral with the ejector handle 400 (e.g., as a single molded part). In yet another embodiment, the journal elements comprise a separate cylindrical shaft that is inserted into mating holes in the ejector handle 400 (and that is inserted into mating holes in the base 600).

Extending outward from the axis of rotation 415 is a first lever arm 420. The first lever arm 420 is held or gripped by the user to actuate the ejector assembly, as will be explained below. To facilitate grasping of the lever arm 420 by the user, the lever arm may include one or more gripping features 422 that enhance the ability of the lever arm to be grasped by the user. For example, as shown in FIGS. 4A-4G, the gripping features 422 may comprise a series of ribs or other protrusions. Other examples of gripping features include a roughened surface and a rubber-coated surface.

Also extending outward from the axis of rotation 415 in a direction approximately perpendicular to the first lever arm 420 is a second lever arm 430. Disposed proximate the end of the second lever arm 430 is one or more engagement elements 435. During operation, the engagement elements 435 will interact with corresponding features on the hook 700 to provide insertion and retraction forces during the installation and removal, respectively, of a blade 200 from the rack 100. Operation of the engagement elements 435 is explained in greater detail below. As will be appreciated by those of ordinary skill in the art, the actual angle ($\theta$) between the first lever arm 420 and the second lever arm 430 (as measured using the axis of rotation 415 as a center) may vary depending upon a variety of factors (e.g., the lengths $\delta_1$, $\delta_2$ of the lever arms 420, 430, the required insertion and retraction forces, etc.) and, further, that selection of this angle, as well as the respective lengths of the first and second lever arms 420, 430 are design choices.

Formed in the body 405 is a cavity 440. The cavity 440 is sized and configured to receive the release mechanism 500, which is described in more detail below. Disposed on a lower surface 443 of the cavity 440 is a spring guide 446. In one embodiment, as shown in FIG. 4G, a compression spring 900 is used to bias the release mechanism 500. The spring guide 446 functions as a seat for this compression spring 900, both locating and retaining the compression spring in position. In the embodiment of FIGS. 4A-4G, the spring guide 446 comprises a tubular structure extending up from the lower surface 443 of cavity 440 and having an outer diameter sized and configured to slide within an inner diameter of the compression spring 900. Movement of the compression spring will also be restrained by a corresponding spring guide 546 (shown in dashed line in FIG. 4G) located on the release mechanism 500, as will be described below. Compression spring 900 may be fabricated from any suitable spring material, including a ferrous metal (e.g., music wire and other spring steels) or a non-ferrous metal (e.g., Beryllium Copper).

Extending through the body 405 and opening into the cavity 440 is a cylindrical hole 450. Cylindrical hole 450 is sized and configured to slidably receive the lock mechanism 800, as will be explained below in greater detail. Located on the exterior surface of the ejector handle body 405 and disposed about the circumference of the cylindrical hole 450 are graduation marks 452, 453. As will be explained below, the graduation marks 452, 453—in conjunction with a registration feature on the lock mechanism 800—provide a visual indication of the state (e.g., either locked or unlocked) of the lock mechanism 800.

Disposed proximate the opening of the cylindrical hole 450 in cavity 440 is a biasing element 460, which is best viewed in the enlarged partial cross-section shown in FIG. 4G (the lock mechanism 800 being shown in dashed line in FIG. 4G). The biasing element 460 is used to bias movement of the lock mechanism 800 in a manner that will be more fully explained in the text below. In one embodiment, the biasing element 460 comprises a resiliently flexible rod that is secured to the ejector handle body 405. For example, in the embodiment of FIGS. 4A-4G, the biasing element 460 (a cylindrical rod) is disposed within a pair of grooves 448 (located at opposite ends of the cylindrical rod) and, in one embodiment, the biasing element 460 is secured in place by a press (or snap) fit within grooves 448. The biasing element 460 may comprise any suitable resiliently flexible material, such as music wire and other spring steels, non-ferrous metals (e.g., beryllium copper), as well as plastic materials. As is also best viewed in FIG. 4G, the ejector handle body 405 may further include a stop element 449 extending upwards from the lower surface 443 of cavity 440. The stop element 449 provides a surface against which the locking mechanism 800 can impinge upon insertion into the cylindrical hole 450, thereby limiting movement of the lock mechanism into the cavity 440.

Also disposed in cavity 440 on opposing sides 441, 442 thereof are bearing holes 470. The bearing holes 470 are disposed on an axis of rotation 475 and are sized and oriented to receive mating journal elements on the release mechanism 500. The bearing holes 470 join the release mechanism 500 to the ejector handle 400 and restrain movement of the release mechanism to rotation about the axis of rotation 475.

The ejector handle 400 may further include one or more registration elements 480, each registration element 480 comprising, in one embodiment, a protrusion extending into the cavity 440. As will be explained below, the registration elements 480 interact with mating registration features on the release mechanism 500 to set the position of the release mechanism relative to the ejector handle body 405 (the release mechanism being rotationally biased toward the registration elements 480 by the compression spring 900).

The ejector handle 400 is movable between a first position (as shown in FIG. 3) wherein the blade 200 is fully inserted into the rack 100 and a second position (see FIG. 9D, which will be described below) wherein the blade is free to be extracted from the rack. Movement of the ejector handle 400—i.e., motion resulting from a user exerting a force on the first lever arm 420, thereby causing the ejector handle to rotate about its axis of rotation 415—from the first position toward the second position will exert an outward extraction force on the blade 200 with respect to the rack 100. Conversely, movement of the ejector handle 400 from the second position toward the first position with exert an inward insertion force on the blade. When the ejector handle 400 is in this first position (see FIG. 3), the ejector handle 400 also functions to secure—when held in place by the release mechanism 500 and, perhaps, locked in position by the lock mechanism 800—the blade 200 in the rack 100. Operation of the ejector handle 400 (as well as release and lock mechanisms 500, 800) is described in greater detail below.

The release mechanism 500 comprises, in one embodiment, any device capable of securing the ejector handle 400 in the first position (i.e., the position shown in FIG. 3, wherein the blade 200 is fully inserted into the rack 100). In one embodiment, the release mechanism 500 releases the ejector handle 400—thereby allowing the ejector handle to freely move toward the second position (as shown in FIG. 9D)—in response to some action taken by the user. For example, the release mechanism 500 may provide a "pushbutton" actuation system that, when depressed by the user, releases the ejector handle 400. Of course, it should be understood that the release mechanism 500 may employ other, alternative actuation schemes. In a further embodiment, the release mechanism 500 comprises any device capable of securing the ejector handle 400 in the second position (again, see FIG. 9D), such that the ejector handle is fixed at a position wherein the blade 200 is free to move outwardly away form the rack 100.

Referring to FIGS. 5A through 5F, one embodiment of the release mechanism 500 is illustrated. The release mechanism 500 comprises a body 505 including journal elements 510 disposed on an axis of rotation 515. The journal elements 510 are used to rotationally coupled with release mechanism 500 to the ejector handle 400. More specifically, when the release mechanism 500 is secured to the ejector handle body 405, the journal elements 510 are disposed in the mating bearing holes 475 on ejector handle 400. Thus, the release mechanism 500 is able to rotate about the axis of rotation 515 (which is generally coincident with the axis of rotation 475 of bearing holes 470). In one embodiment, as shown in FIGS. 5A-5F, the journal elements 510 comprise cylindrical protrusions, each extending outwardly from the release mechanism body 505, as shown in FIGS. 5A-5F. In a further embodiment, each of the journal elements 510 is formed integral with the body 505 (e.g., as a single molded part). In yet another embodiment, the journal elements comprise a separate cylindrical shaft that is inserted into mating holes in the release mechanism 500 (and that is inserted into mating holes in the ejector handle 400).

As noted above, the ejector handle 400 is movable between a first position wherein the blade 200 is fully inserted into the rack 100 and a second position wherein the blade is free to be extracted from the rack. When the ejector handle 400 is in this first position (see FIG. 3), the ejector handle 400 also secures the blade 200 in the rack 100. As noted above, one function of the release mechanism 500 may be to hold the ejector handle 400 in this first position until the user desires to release the ejector handle 400 and eject the blade 200. The release mechanism 500 is able to rotate about the axis of rotation 515 between an initial position wherein the release mechanism will hold the ejector handle 400 in its first position and a depressed position wherein the ejector handle has been released and is free to move towards its second position (compare FIGS. 9A and 9B, which are to be described below). Operation of the release mechanism 500, as well as ejector handle 400 and lock mechanism 800, is described in more detail below.

Extending outward from the axis of rotation 515 is a first lever arm 520. The first lever arm 520 of release mechanism 500 is depressed or otherwise acted upon by the user to actuate the release mechanism (i.e., to release ejector handle 400, as noted above). To facilitate contact with the release mechanism 500 by the user, an outer surface 424 of the body 505 may include one or more gripping features 426 that enhance the ability of the first lever arm 520 to be contacted by the user. For example, as shown in FIGS. 5A-5F, the gripping features 426 may comprise a series of raised protrusions and/or depressions. Other examples of gripping features include a roughened surface and a rubber-coated surface.

Also extending outward from the axis of rotation 515 of release mechanism 500 is in a direction generally opposing the first lever arm 520 is a second lever arm 530. Disposed proximate the end of the second lever arm 530, and extending outwardly from a lower surface 507 of body 505, is a catch element 535. During operation, the catch element will interact with a corresponding notch on the base 600 to hold the release mechanism 500—and, hence, the ejector handle 400—at a desired position (e.g., the first, unreleased position) pending actuation of the release mechanism (e.g., depression of the first lever arm 520), as previously suggested. As will be appreciated by those of ordinary skill in the art, the actual angle ($\alpha$) between the first lever arm 520 and the second lever arm 530 (as measured using the axis of rotation 515 as a center) may vary depending upon a variety of factors (e.g., the lengths $\lambda_1$, $\lambda_2$ of the lever arms 520, 530, the desired biasing and actuation forces for the release mechanism, etc.) and, further, that selection of this angle, as well as the respective lengths of the first and second lever arms 520, 530 are design choices.

Also disposed on the lower surface 507 of body 505 and extending outwardly therefrom is the spring guide 546, as previously described. In a manner similar to the spring guide 446 on ejector handle 400, the spring guide 546 functions to locate and restrain movement of the compression spring 900 during operation. In the embodiment of FIGS. 5A-5F, the spring guide 546 comprises a hollow tubular structure extending outwards from surface 507 and having an inner diameter sized and configured to slide over an outer diameter of the compression spring 900 (shown in dashed line if FIG. 5F). The spring guides 446, 546 may also facilitate assembly of the ejector handle 400 and release mechanism 500. Prior to installation of the release mechanism 500 into ejector handle 400, one end of the compression spring 900 may be slid over spring guide 446 on the ejector handle, which will locate and hold the spring in place during assembly. When the release mechanism 500 is coupled with the ejector handle 400—i.e., by inserting its journal element 510 into the mating bearing holes 470 on the ejector handle—the spring guide 546 on the release mechanism will function to locate and hold an opposing end of the compression spring 900 in place.

One or more registration features 550 may also be formed on the lower surface 507 of the release mechanism body 505. In the embodiment shown in FIGS. 5A-5F, the registration features 550 comprise depressions sized and configured to mate with corresponding registration elements 480 on the ejector handle 400. When the release mechanism 500 is in the initial position—under application of a biasing force generated by compression spring 900, as described above—at which the release mechanism holds the ejector handle 400 in its first position (wherein the blade 200 is secured in the rack 100), the registration features 550 engage the mating registration elements 480 on ejector handle 400 to set the position of the release mechanism relative to the ejector handle (thereby controlling, in one embodiment, the depth to which catch element 535 extends into its mating notch on the base 600).

The release mechanism 500 further includes a lock key 560 extending from the lower surface 507. In the embodiment of FIGS. 5A-5F, the lock key 560 comprises a rectangular protrusion extending outwards for lower surface 507 and, in yet another embodiment, the lock key 560 is formed integral with the body 505 (e.g., as a single molded part). In other embodiments, however, the lock key 560 may have alternative shapes and may comprise a separate part attached to the release mechanism body 505. As will be explained below, the lock key 560 is sized and oriented to engage the lock mechanism 800 to fix the position of the release mechanism 500 and, hence, to lock the ejector handle 400 into position.

The base 600 comprises, in one embodiment, any device or mechanism capable of securing the ejector assembly 300 to the blade 200 (except hook 700, which is attached to the rack 100). In another embodiment, the base 600 comprises a device capable of restraining movement of the ejector handle 400 (e.g., to rotational motion). In a further embodiment, the base 600 comprises any device providing one or more features (e.g., a notch, as described below) that interact with the release mechanism 500 (e.g., catch element 535) to hold the release mechanism at a desired position.

Referring now to FIGS. 6A-6G, illustrated is one embodiment of the base 600. The base 600 comprises a body 605, and the body 605 is capable of being attached to the front panel 220 of blade 200. In one embodiment, as shown in the figures, threaded fasteners (or other fasteners such as rivets) may be inserted through holes 610 extending through the body 605 and then attached to the blade 200. However, it should be understood that any other suitable fasteners (e.g., dowel pins) or method of attachment (e.g., adhesive bonding, diffusion bonding, ultrasonic welding, etc.) may be employed to attach the base 600 to a blade.

Extending into the body 605 of base 600 are bearing holes 620, which are coincident along a center axis 625. The bearing holes 620 are sized and oriented to slidably receive the journal elements 410 on the ejector handle 400, such that the ejector handle 410 is rotationally coupled with the base 600, with the ejector handle being capable of rotation about the center axis 625 (and axis of rotation 415 of the ejector handle). In one embodiment, disposed on the body 605 and extending from bearing holes 620 outwardly to the edge of the body 605 are beveled surfaces 623. At the circumference of the bearing holes 620, each beveled surface 623 is generally level with the outer surface of the base body 605 and, as the beveled surface progresses outward from its corresponding bearing hole, gradually deepens. Such beveled surfaces 623 may facilitate assembly of the ejector handle 400 onto the base 600, by providing grooves through which the ejector handle journal elements 410 may traverse as the ejector handle is placed over the base (e.g., the journal elements 410 "ride" in these grooves, which directs the journal elements into the bearing holes 620).

The base 600 further includes a notch element 640 (or other similar feature) to "capture" the catch element 535 on release mechanism 500. The notch element 640 is best seen in the cross-sectional view of FIG. 6G, as well as FIGS. 6B and 6D. As suggested above, during operation, the catch element 535 will interact with the notch element 640 to hold the release mechanism 500 at a desired position (i.e., a position at which the release mechanism prevents movement of the ejector handle 400). Disposed adjacent the notch member 640 is a bearing surface 650, and disposed adjacent to this bearing surface 650 is a secondary notch 660. Operation of the base 600, release mechanism 500, and ejector handle 400—and, in particular, the interaction between catch element 535 and the notch member 640, as well as bearing surface 650 and secondary notch 660—is described in greater detail below.

The hook 700 comprises, in one embodiment, any device or mechanism capable of engaging the ejector handle 400 to secure the ejector handle into position and, accordingly, to secure the blade 200 within the rack 100. In another embodiment, the hook 700 comprises any device providing one or more surfaces (or other features) with which the ejector handle 400 may interact to generate insertion and retraction forces (and, in one embodiment, to obtain a mechanical advantage during insertion or retraction).

Figure 1:
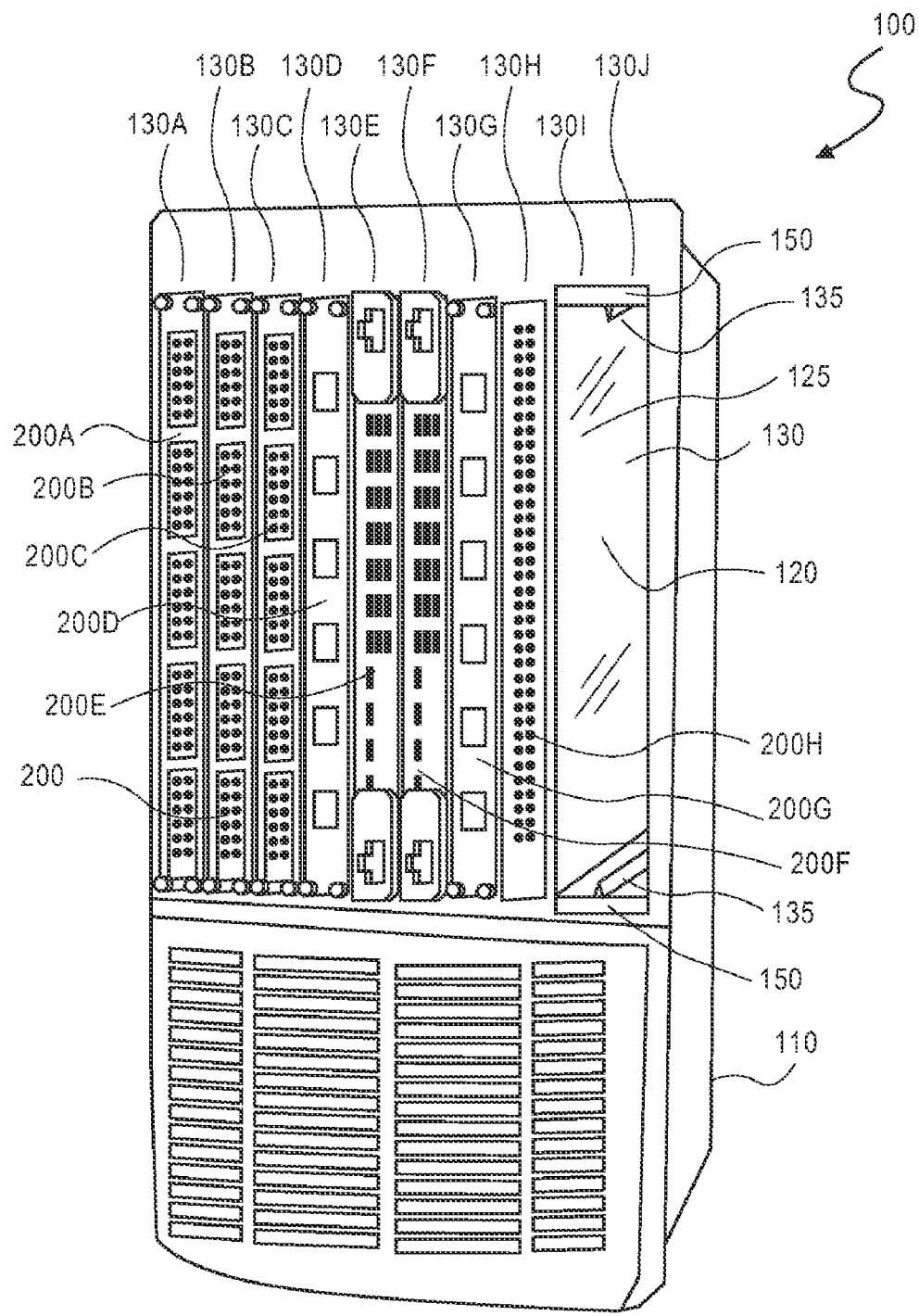
FIG. 1 is a perspective view of an exemplary conventional rack for receiving a number of blades

Illustrated in FIGS. 7A through 7E is one embodiment of the hook 700. The hook 700 comprises a body 705, this body 705 capable of being attached to the rack 100 (e.g., to a front surface 150, as shown in FIGS. 1 and 3). In one embodiment, as shown in the figures, threaded fasteners (or other fasteners such as rivets) may be inserted through holes 710 extending through the body 705 (and opening into a cavity 712 formed in body 705). The fasteners are then attached to a surface of the rack 100. It should, however, be understood that any other suitable fasteners (e.g., dowel pins) or method of attachment (e.g., adhesive bonding, diffusion bonding, ultrasonic welding, etc.) may be employed to attach the hook 700 to the rack 100.

Disposed on the hook body 705 are one or more retaining elements 720. During operation, the retaining elements 720 interact with the corresponding engagement elements 435 on ejector handle 400 in order to generate insertion and retraction forces during installation and removal, respectively, of the blade 200 from the rack 100. The cooperation between engagement elements 435 and retaining elements 720 also functions to secure the blade 200 within the rack 100 when the ejector handle 400 is locked into its first position (see FIG. 3), wherein the engagement elements 435 and retaining elements 720 are fully engaged. The retaining elements 720 each include a surface 727 that is contoured and oriented to slidably mate with a surface of a corresponding engagement element 435 on the ejector handle and, further, to produce the desired insertion or retraction forces. Operation of the ejector handle 400, release mechanism 500, base 600, and hook 700—and, in particular, interaction between the retaining elements 720 and engagement elements 435—is explained below in greater detail (see FIGS. 9A-9D).

The lock mechanism comprises, in one embodiment, any device or mechanism capable holding the release mechanism 500 at its initial position, such that the ejector handle 400 cannot be released and is, therefore, locked into position (i.e., the ejector handle's first position wherein extraction of the blade 200 from the rack 100 is inhibited). In another embodiment, the lock mechanism 800 is capable of providing a visual indication to the user regarding its status (e.g., locked or unlocked position).

Illustrated in FIGS. 8A through 8G is one embodiment of the lock mechanism 800. The lock mechanism 800 comprises a generally cylindrical body 805 with a center axis 815 and having opposing ends 806, 807. The lock body 805 is sized and configured to be slidably received in the cylindrical hole 450 of the ejector handle 400. The end 807 of body 805 may include a taper 808 to facilitate insertion of the lock body 805 within cylindrical hole 450 (and, as will be explained below, to facilitate insertion of the lock body 805 over the biasing element 460, such that the biasing element lies in a cylindrical groove 840 of lock body 805).

Disposed proximate the end 807 of lock body 805 and extending parallel to the center axis 815 is a slot 810. The slot 810 is sized and oriented to receive the lock key 560 of release mechanism 500. During operation, slot 810 provides a space into which the lock key 560 can travel when the lock mechanism 800 is in the unlocked position and the release mechanism 500 is actuated. Operation of the slot 810 of lock mechanism 800 and lock key 560 of release mechanism 500 is explained in greater detail below with respect to FIGS. 10A through 13C.

Disposed at the end 806 of lock body 805 is a drive element 820. The drive element 820 enables the user to rotate or otherwise actuate the lock mechanism 800 (e.g., to rotate the lock mechanism between the locked and unlocked positions). In the embodiment of FIGS. 8A-8G, the drive element 820 comprises a Phillips drive head. It should be understood, however, that the drive element 820 can comprise any other suitable type of drive (e.g., a flat screwdriver head, a hex head, etc.) and, further, that the lock mechanism 800 may include an external feature (e.g., a tab or handle) that allows the user to actuate the lock mechanism without the use of a tool (such as a Phillips screwdriver).

In one embodiment, the lock mechanism 800 further includes an indicator element 830. In the embodiment shown in FIGS. 8A-8G, the indicator element 830 comprises a protrusion extending upwards from end 806 of lock body 805. As will be further described below, the indicator element 830 in conjunction with the graduation marks 452, 453 on ejector handle 400 provide a visual indication of the state, or position, of the lock mechanism 800 (e.g., either locked or unlocked). In one embodiment, as shown in the figures, the indicator element 830 and slot 810 are offset from one another by an angle of one-hundred-eighty degrees (180°).

Disposed proximate the end 807 and extending about the circumference of the lock body 805 is a cylindrical groove 840. The cylindrical groove 840 is sized and configured to receive the biasing element 460 (shown in dashed line in FIG. 8D), such that the lock mechanism 800 "snaps" into place when inserted into the cylindrical hole 450 and is held in place within the ejector handle. As noted above, the taper 808 may facilitate insertion of the lock body 805 into cylindrical hole 450 and over the biasing element 460. The biasing element 460 also provides a detent force on the lock body 805 (e.g., a force resulting from bending of biasing element 460) that provides a resistance to rotation of the lock body, thereby preventing unintentional rotation of this component. In addition, the cylindrical groove 840 includes a contoured surface 844 (i.e., the bottom of the groove 840) that interacts with the biasing element 460 to provide tactile feedback to the user indicative of the movement and position of the lock mechanism 800 during actuation, as will be explained below in more detail.

Each of the components of the ejector assembly 300—i.e., ejector handle 400, release mechanism 500, base 600, hook 700, and lock mechanism 800—may be constructed from any suitable material (e.g., plastics or metals) using any suitable fabrication technique (e.g., molding, stamping, extrusion, machining, etc.) or combination of techniques. In one embodiment, each of the ejector handle 400, release mechanism 500, base 600, hook 700, and lock mechanism 800 is fabricated from a plastic material using an injection molding process. For example, in one embodiment, each of these components is constructed from a polycarbonate and ABS (acrylonitrile-butadiene-styrene) resin referred to as Cycoloy™ and available from GE Plastics. Also, the various parts of the ejector assembly 300 may be assembled using any suitable technique. In one embodiment, the ejector handle 400, release mechanism 500, and base 600 are secured together using a "snap fit" process, and no fasteners are needed to assemble these parts (although the base 600 and hook 700 may be attached to the blade 200 and rack 100, respectively, using fasteners, as noted above).

Operation and use of the ejector assembly 300 may be better understood by reference to FIGS. 9A through 9D, which figures illustrate the functioning of—and interaction between—the ejector handle 400, release mechanism 500, base 600, and hook 700. Note that, in FIGS. 9A-9D, operation of the lock mechanism 800 is not shown. Functioning of the lock mechanism 800 will be described below with respect to FIGS. 10A through 13C.

In each of FIGS. 9A-9D, the ejector handle 400, release mechanism 500, base 600, and hook 700 are illustrated. However, the ejector handle 400 is shown partially cut away in order to allow operation and/or movement of the release mechanism 500, base 600, and hook 700 to be more easily observed. However, although not directly indicated in FIGS. 9A-9D, it should be understood that the release mechanism 500 is coupled with the ejector handle 400 which, in turn, is coupled with the base 600. More specifically, as described above, motion of the release mechanism 500 is restrained to rotation about the common axis 475, 515 of the ejector handle 400 and release mechanism, respectively. Similarly, motion of the ejector handle 400 is retrained to rotation about the common axis 625, 415 of the base 600 and ejector handle, respectively.

Figure 9A:
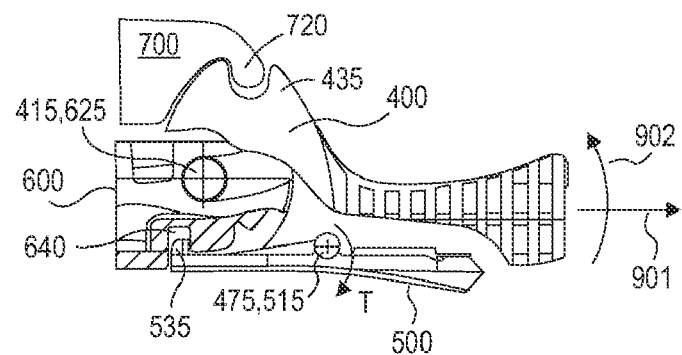
FIGS. 9A-9D are schematic diagrams illustrating operation of the ejector assembly of FIG. 3.

Referring first to FIG. 9A, the ejector assembly is shown in the "closed" position. In the closed position, the blade 200 (which is coupled with base 600, but is not shown in FIGS. 9A-9D) is fully inserted within its corresponding bay of the rack 100 (also not shown in FIGS. 9A-9D, but it should be understood that hook 700 is attached to the rack). Outward movement of the base 600—and, hence, the attached blade 200—in a direction indicated by arrow 901 is prevented by the interaction between the ejector handle 400 and the hook 700. In particular, the engagement elements 435 on ejector handle 400 engage with the corresponding retaining elements 720 on hook 700 to fix the position of the base 600.

With continued reference to FIG. 9A, to maintain the ejector handle 400 at the first position, as shown in FIG. 9A—i.e., a position wherein the engagement elements 435 engage the retaining elements 720 to inhibit outward movement of the base 600—the catch element 535 on release mechanism 500 engages the notch element 640 on base 600. The engagement between catch element 535 and notch 640 is maintained by a biasing torque (T) exerted on the release mechanism 500 by action of the compression spring 900, as described above (it should, of course, be understood that other types of springs, such as a torsion spring, may be used in lieu of compression spring 900 to generate the torque T). The biasing torque (T) biases the release mechanism 500 towards its initial, undepressed position, as shown in FIG. 9A. Interference between the catch element 535 and notch 640 prevents rotation of the ejector handle 400 (about common axis 415, 625 in a direction denoted by arrow 902), thereby fixing the position of the ejector handle and preventing ejection of the blade 200 from rack 100.

Figure 9B:
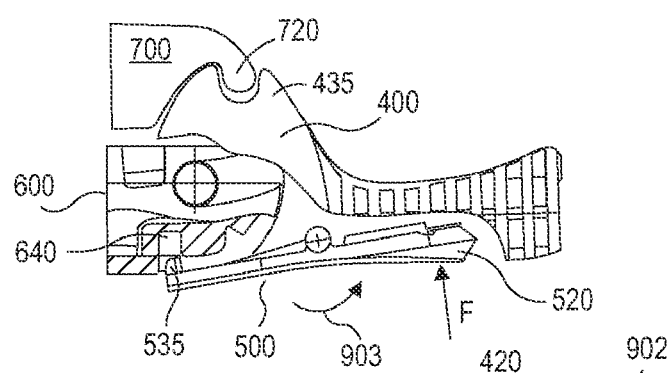

Referring next to FIG. 9B, the release mechanism 500 has been actuated. To actuate the release mechanism 500, the user applies a force (F) to the first lever arm 520 that generates a torque sufficient to overcome the biasing torque (T) generated by compression spring 900. When the biasing torque (T) of compression spring 900 is overcome, the release mechanism 500 will rotate about the axis of rotation 475, 515 in a direction indicated by arrow 903, thereby withdrawing the catch element 535 from the notch 640. When the release mechanism reaches the depressed position, as shown in FIG. 9B, the catch element 535 if fully disengaged from the notch element 640, which then allows the ejector handle 400 to rotate freely.

Figure 9C:
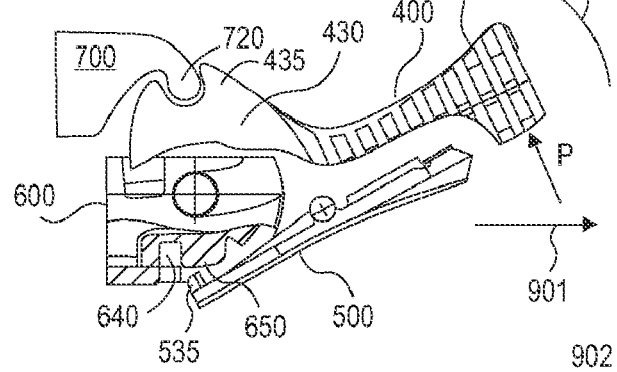
Figure 9D:
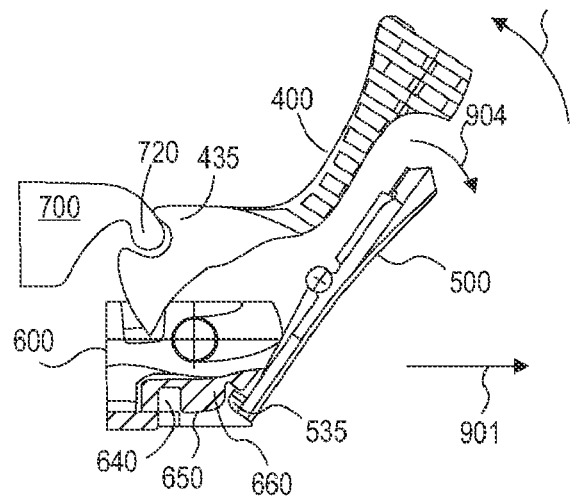

Referring now to FIG. 9C, with the catch element 535 on release mechanism 500 disengaged from the notch 640 on base 600, the ejector handle 400 is free to rotate about its axis of rotation 415, 625. This is illustrated in FIG. 9C, where the ejector handle 400 has been rotated in the direction denoted by arrow 902. As the ejector handle rotates, the interaction between the surfaces of the engagement elements 435 and the surfaces of the retaining elements 720 causes movement of the base 600 in a direction indicated by arrow 901. One could analogize the interaction between the engagement elements 435 and retaining elements 720 to that of a cam (retaining elements 720) and a follower (engagement elements 435). Note that motion of the base 600 is generally restrained in the direction 901 by the movement of the blade 200, whose movement is guided by the rack 100. Note also that, as the ejector handle 400 begins to rotate, the catch element 535 traverses over the bearing surface 650 of base 600 (and, at this point, allowing the user can let go of the release mechanism 500).

Rotation of the ejector handle 400 in the direction 902 is caused by the user exerting a force (P) on the lever arm 420, which causes the ejector handle 400 to rotate about its axis of rotation 415, 625. As previously noted, when the blade 200 is withdrawn from the rack 100, the extraction force needed to pull the blade from the rack must be sufficient to overcome the opposing force resulting from the engagement between the blade's connector 240 and a mating receptacle on the rack's backplane. The necessary extraction force to pull out the blade can often be significant. In one embodiment, to aid in removing the blade 200 for the rack 100 and, further, to increase the extraction force provided by the ejector assembly 300, the ejector handle 400 provides a mechanical advantage. The mechanical advantage generated by the ejector assembly is proportional to the ratio of the length ($\delta_1$) of the first lever arm 420 to the length ($\delta_2$) of the second lever arm 430 (i.e., $\delta_1/\delta_2$).

Turning to FIG. 9D, the ejector assembly is shown after further rotation of the ejector handle 400 in the direction denoted by arrow 902, wherein the base 600 (and attached blade 200) have also experienced further motion in the direction of arrow 901. With the ejector handle 400 at the position shown in FIG. 9D, the catch elements 435 on the ejector handle are free to disengage from the retaining elements 720 on hook 700. Thus, the base 600 and attached blade 200 can be pulled further in the direction 901 to extract the blade from the rack 100. In one embodiment, when the ejector handle 400 reaches the position shown in FIG. 9C, the connector 240 on the blade 200 is disengages from its mating receptacle on the rack's back plane. During further extraction of the blade 200, the user may continue to pull on the ejector handle 400, which is fixed into the position shown in FIG. 9D by release mechanism 500, as will now be described.

With continuing reference to FIG. 9D, the catch element 535 on release mechanism 500 has traversed the bearing surface 650 on base 600 and has fallen into secondary notch 660. The catch element 535 is biased into the secondary notch 660 under application of the biasing torque (T) created by compression spring 900, as previously described. As the catch element 535 progresses into the secondary notch 660, the release mechanism 500 returns (in the direction of arrow 904) to its initial, un-depressed position (the same as that shown in FIG. 9A). The interaction between the catch element 535 and secondary notch 660 prevents further rotation of the ejector handle 400 in the direction of arrow 902. In addition, however, the interaction between the catch element 535 and secondary notch 660 inhibits rotation of the ejector handle 400 in the opposing direction (opposite to arrow 902), until the release mechanism is again actuated (to disengage catch element 535 from secondary notch 660). Thus, the release mechanism 500 functions to fix the ejector handle 400 in either one of two positions: (1) the first position shown in FIG. 9A wherein the ejector handle 400 prevents extraction of the blade; and (2) the second position shown in FIG. 9D wherein the blade is free to be pulled from the rack. Note that, in the second position shown in FIG. 9D, the ejector handle 400 is fixed in place by the release mechanism 500—thereby preventing rotation in both direction 902 and the opposite direction—which allows the user to continue grasping the ejector handles 400 during removal of the blade 200 from rack 100.

To install the blade 200 in the rack 100, the process proceeds in a manner similar, but reverse in order, to that described above with respect to FIGS. 9A-9D. Referring to FIG. 9D, the blade 200 is inserted into the rack until the engagement elements 435 on the ejector handle 400 contact the retaining elements 720 on hook 700. The release mechanism 500 is then actuated (to disengage the catch element 535 from secondary notch 660) to enable rotation of the ejector handle 400, which can then be rotated in a direction opposite to arrow 902. As the ejector handle 400 rotates in this opposing direction, the engagement element 435 engage the retaining elements 720 (see FIG. 9C), such that the retaining elements 720 are "captured" in the engagement elements 435, thereby allowing an insertion force to be applied to the base 600 and attached blade 200.

Referring again to FIGS. 9C and 9B, continued rotation of the ejector handle 400 causes inward movement of the base 600 and blade 200 in a direction opposite to that indicated by arrow 901. As the ejector handle is rotated, a mechanical advantage is again obtained (in a manner similar to that described above) to enhance the insertion force that can be applied to the blade 200. The insertion force needed to push the blade into its bay of rack 100 can be significant due to the forces needed to plug the connector 240 into its mating receptacle on the rack's backplane. When the base 600 and ejector handle 400 reach their respective positions shown in FIG. 9A, the catch element 525 on release mechanism 500 returns (under application of the biasing torque generated by compression spring 900) to its position within the notch element 640 on base 600, thereby fixing the position of the ejector handle 400.

When the ejector handle 400 is at the position shown in FIG. 9A, with the release mechanism 500 fixing the ejector handle in this orientation, the release mechanism—and, hence, the ejector handle—may be locked into their respective positions by the lock mechanism 800. Operation of the lock mechanism is now described in greater detail.

Figure 10A:
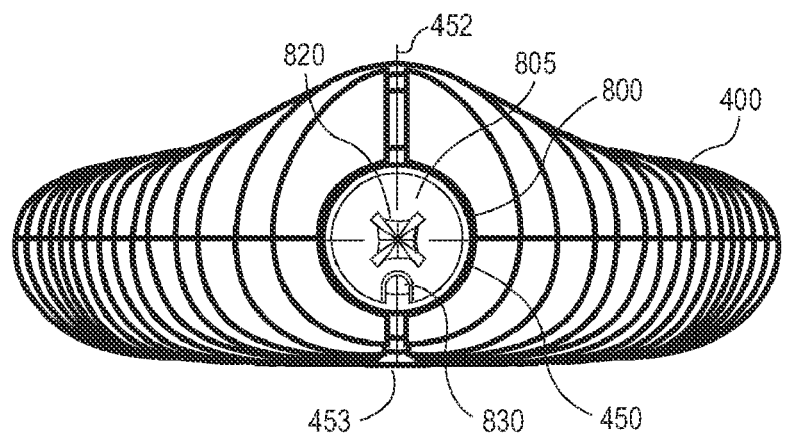
FIGS. 10A-10C are schematic diagrams further illustrating operation of the assembly of FIG. 3.
Figure 10B:
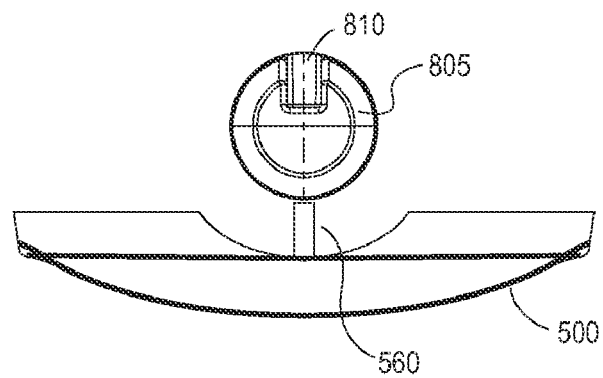
Figure 10C:
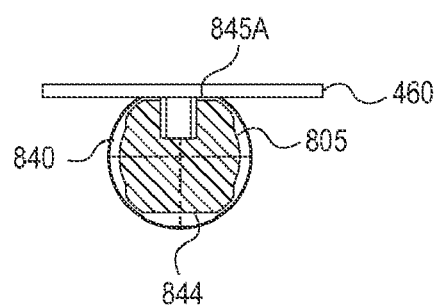

Referring to FIGS. 10A through 10C, the lock mechanism 800 is shown in the locked position. When the lock mechanism 800 is in the locked position, the indicator element 830 on lock body 805 is aligned with graduation mark 453 on the ejector handle 400, as shown in FIG. 10A, thereby providing a visual indication to the user that the lock mechanism is in the locked condition. With the lock body 805 in the locked orientation, motion of the lock key 560 on release mechanism 500 is restricted by the outer surface of the lock body 805, as shown in FIG. 10B. Accordingly, the release mechanism 500 is fixed in its initial, undepressed position, and the ejector handle 400 is, therefore, held in place by the release mechanism (i.e., via the catch member 535 resting in notch element 640 under the biasing torque exerted by compression spring 900, as describe above). Also, as shown in FIG. 10C, when the lock mechanism 800 is in the locked position, a first portion 845a of the contoured surface 844 is in contact with (or at least in close proximity to) the biasing element 460 that is disposed within groove 840. In addition, note that the location of the lock mechanism 800 on ejector handle 400—i.e., recessed in the end of the ejector handle (see FIG. 3)—prevents inadvertent rotation of the lock body due to casual or unintended contact.

Figure 11A:
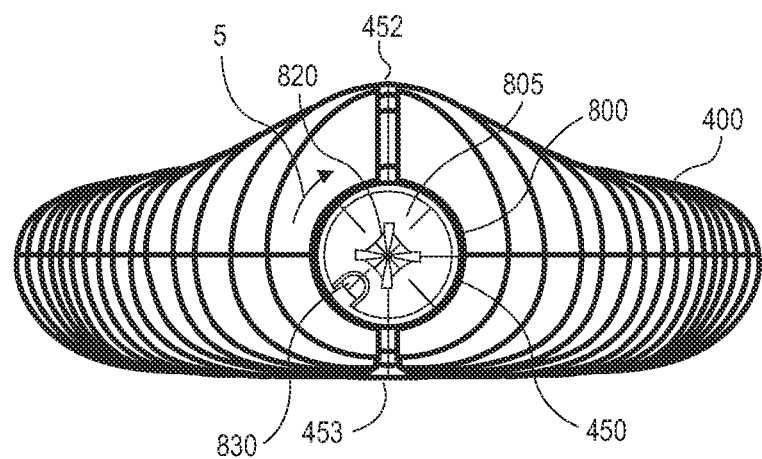
FIGS. 11A-11C are schematic diagrams further illustrating operation of the ejector assembly of FIG. 3.
Figure 11B:
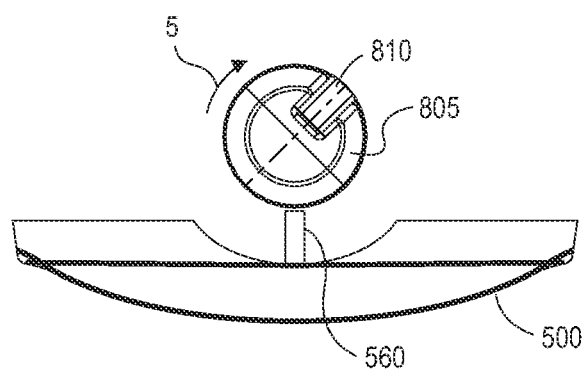
Figure 11C:
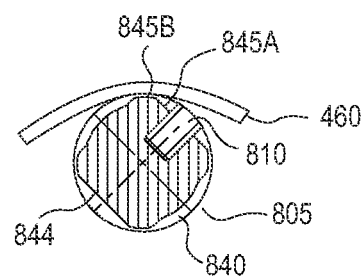

Referring next to FIGS. 11A through 11C, actuation of the lock mechanism 800—to place the lock mechanism in the unlocked state—has commenced. As shown in FIG. 11A, the lock body 805 has been rotated (approximately forty-five degrees) in a direction indicated by arrow 5. Rotation of the lock body 805 is achieved by drive element 820 (which, in the illustrated embodiment, can be actuated using a Phillips drive head). The slot 810 on lock body 805 rotates toward the lock key 560, as shown in FIG. 11B. Note that the lock body 805, when view from the end of the ejector handle 400, is rotating in a clockwise direction. However, it should be understood that the lock mechanism 800 may also be actuated via counter-clockwise rotation—i.e., in other words, the lock mechanism is, in one embodiment, bi-directional. With reference to FIG. 11C, a second portion 845b of the contoured surface 844 in groove 840 is now in contact with the biasing element 460. Because the second portion 845b is greater in radius than the first portion 845a (see FIG. 10C), the biasing element 460 is subjected to bending, as shown in FIG. 11C. This bending of the biasing element 460 exerts a detent force against the lock body 805 that provides some resistance to rotation of the lock body and, further, that provides tactile feedback to the user. Such tactile feedback will provide to the user an indication regarding the extent to which the lock body 805 has been rotated.

Figure 12A:
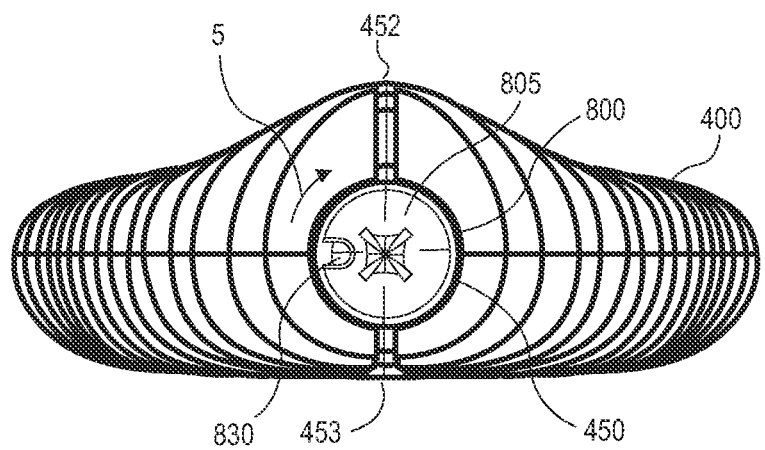
FIGS. 12A-12C are schematic diagrams further illustrating operation of the ejector assembly of FIG. 3.
Figure 12B:
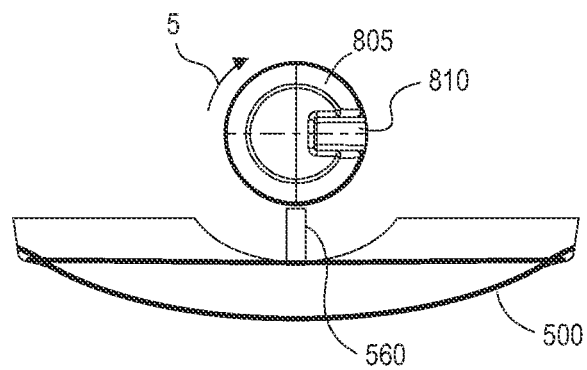
Figure 12C:
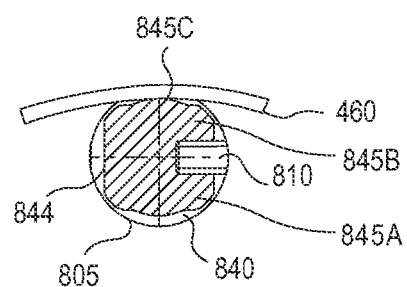

Referring now to FIGS. 12A through 12C, the lock body 805 has been further rotated (using drive element 820) in the direction of arrow 5 (the lock body now having been rotated approximately ninety degrees), as shown in FIG. 12A. The slot 810 on lock body 800 is further rotated towards the lock key 560, as shown in FIG. 12B. Referring to FIG. 12C, a third portion 845c of the contoured surface 844 in groove 840 is now in contact with the biasing element 460. The radius of the third portion 845c is less than that of the second portion 845b, thereby reducing the amount of bending in biasing element 460 and altering the force exerted on the lock body by the biasing element. This change in the force exerted by the biasing element 460 on the lock body 805 provides additional feedback to the user indicative of the lock body's position. Note that the radius of the third portion 845c of contoured surface 844 may be greater than that of the first portion 845a (although less than that of the second portion 845b).

Figure 13A:
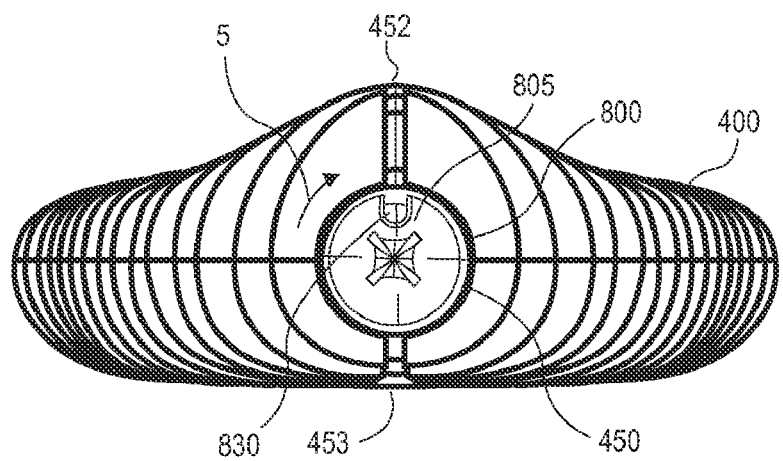
FIGS. 13A-13C are schematic diagrams further illustrating operation of the ejector assembly of FIG. 3.
Figure 13B:
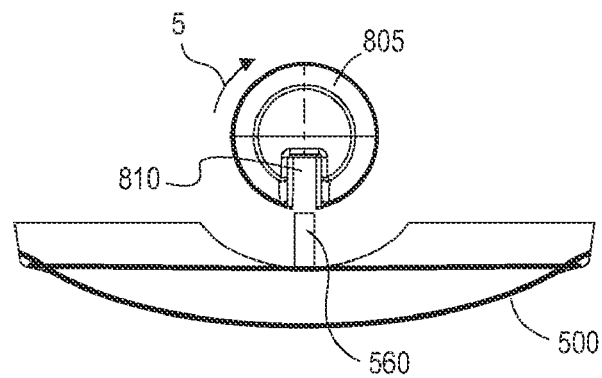
Figure 13C:
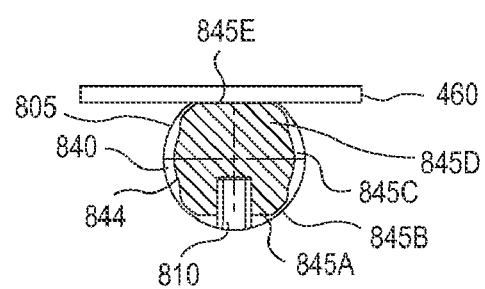

Turning finally to FIGS. 13A through 13C, the lock body 805 has been further rotated in the direction of arrow 5 to the unlocked position (the lock body now having been rotated approximately one hundred-eighty degrees). In the unlocked position, the indicator element 830 on lock body 805 is now aligned with the other graduation mark 452, as shown in FIG. 13A, to indicate to the user that the lock mechanism is in the unlocked position. As shown in FIG. 13B, the slot 810 on lock body 805 is now aligned with the lock key 560 of lock mechanism 500, and the lock key 560 is now free to travel into the slot 810. Therefore, the user can now actuate the release mechanism 500 to release the ejector handle 400, as described above. With reference to FIG. 13C, a fifth portion 845e of the contoured surface 844 in groove 840 is now in contact with (or at least in close proximity to) the biasing element 460. As the lock body 805 is rotated from the orientation of FIG. 12C (third portion 845c of contoured surface 844 in contact with biasing element 460) to that of FIG. 13C (fifth portion 845e in contact with the biasing element), a fourth portion 845d of the contoured surface also impinges against the biasing element 460. Again, as described above, the changes in radius between the various portions of the contoured surface 844—and, hence, the changes in bending of the biasing element 460 produced by the contoured surface—from third portion 845c to fifth portion 845e provide tactile feedback to the user that is indicative of the lock body's position. Note that, should the user have chosen to rotate the lock body 805 in a direction opposite to that indicated by arrow 5—again, the lock mechanism 800 is, in one embodiment, bi-directional—the biasing element 460 would experience a similar pattern of bending (the result of a similar groove contour) and, therefore, the user would have received a similar pattern of tactile feedback.

To again place the lock mechanism 800 in its locked state, the lock body 805 is simply rotated through a one hundred-eighty degree angle (either in the direction of arrow 5 or the opposing direction) to the orientation shown in FIGS. 10A-10C. The interaction between the contoured surface 844 in the groove 840 will provide a similar tactile feedback to the user when returning the lock mechanism 800 to its locked position.

Embodiments of a ejector assembly 300 having been described above, those of ordinary skill in the art will appreciate the advantages of the disclosed embodiments. The ejector assembly includes a release mechanism 500 that prevents inadvertent movement of the ejector handle 400, wherein this release mechanism can be easily actuated (e.g., by push-button operation) to release the ejector handle. The ejector assembly further includes a lock mechanism 800 that prevents unintentional extraction of a blade from a rack, thereby minimizing any electrical hazard that could result when a blade is unintentionally (or without authorization) ejected. The lock mechanism can be easily actuated with readily available tools (e.g., a Phillips screwdriver), and this mechanism can provide tactile feedback to the user indicative of the position of the lock mechanism. The lock mechanism can also provide a visual indication to the user regarding the lock mechanism's state (e.g., either locked or unlocked). Further, the various parts of the ejector assembly are amenable to fabrication using injection molded plastic.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

What is claimed is:

1. An ejector comprising:
    an ejector handle to be rotationally coupled with a blade, the ejector handle movable between a first position wherein the blade is secured in a rack and a second position wherein the ejector handle can be removed from the rack;
    a release mechanism coupled with the ejector handle, the release mechanism to secure the ejector handle in the first position and, upon actuation, to allow movement of the ejector handle toward the second position; and
    a lock mechanism disposed in the ejector handle and movable between a locked position and an unlocked position, wherein the lock mechanism, when in the locked position, engages the release mechanism to prevent actuation of the release mechanism.

2. The ejector of claim 1, further comprising a base to be attached to the blade, wherein the ejector handle is rotationally coupled with the base.

3. The ejector of claim 2, wherein the ejector handle comprises:
    a body rotationally coupled with the base about an axis of rotation, the body including a first lever arm extending from the axis of rotation and a second lever arm extending from the axis of rotation;
    a cavity formed in the body, the cavity able to receive the release mechanism; and
    an engagement element disposed on the second lever arm, the engagement element to interface with a mating retaining element disposed on the rack while the ejector handle is moved between the first and second positions.

4. The ejector of claim 3, wherein the ejector handle is movable between the first and second positions by exerting a force on the first lever arm.

5. The ejector of claim 4, wherein the first lever arm has a length greater than a length of the second lever arm.

6. The ejector of claim 5, wherein the first lever arm and the second lever arm are separated by an angle of approximately ninety degrees.

7. The ejector of claim 2, wherein the release mechanism comprises:
    a body rotationally coupled with the ejector handle about an axis of rotation, the body including a first lever arm extending from the axis of rotation and a second lever arm extending from the axis of rotation, the body movable between an initial position and a depressed position; and
    a catch element disposed on the second lever arm, the catch element for engaging a corresponding notch on the base when the body is at the initial position, the interaction between the catch element and the notch preventing movement of the ejector handle;
    wherein the release mechanism is actuated by applying a force to the first lever arm to move the body from the initial position to the depressed position, the catch element disengaging the notch when the body is at the depressed position.

8. The ejector of claim 7, wherein the catch element engages a secondary notch on the base when the body is moved to the depressed position, the interaction between the catch element and the secondary notch holding the body at the depressed position.

9. The ejector of claim 2, wherein the base, ejector handle, release mechanism, and lock mechanism are each formed from a molded plastic.

10. The ejector of claim 9, wherein the base, ejector handle, release mechanism, and lock mechanism are assembled together using a snap-fit process.

11. The ejector of claim 3, wherein the mating retaining element forms part of a hook body that is attached to the rack.

12. The ejector of claim 11, wherein the engagement element interacts with the mating retaining element to secure the blade in the rack when the ejector handle is at the first position.

13. The ejector of claim 12, wherein the engagement element interacts with the mating retaining element to exert an extraction force on the blade when the ejector handle is moved from the first position to the second position.

14. The ejector of claim 13, wherein the engagement element interacts with the mating retaining element to exert an insertion force on the blade when the ejector handle is moved from the second position to the first position.

15. The ejector of claim 1, wherein the lock mechanism comprises:
    a cylindrical body disposed within a cylindrical hole in the ejector handle, the cylindrical body rotatable between the locked and unlocked positions; and
    a slot disposed proximate an end of the cylindrical body and oriented parallel to an axis of the cylindrical body, the slot sized and oriented to receive a key disposed on the lock mechanism;
    wherein the slot can receive the key upon actuation of the release mechanism.

16. The ejector of claim 15, further comprising:
    an indicator element disposed at an opposing end of the cylindrical body;
    a first registration feature disposed on the ejector handle proximate a periphery of the cylindrical hole, wherein the first registration feature indicates, when the indicator element of the lock mechanism is aligned therewith, that the lock mechanism is in the locked position; and a second registration feature disposed on the ejector handle proximate the periphery of the cylindrical hole, wherein the second registration feature indicates, when the indicator element of the lock mechanism is aligned therewith, that the lock mechanism is in the unlocked position.

17. The ejector of claim 16, further comprising a drive element disposed on the opposing end of the cylindrical body, the drive element allowing a user to rotate the cylindrical body between the locked and unlocked positions.

18. The ejector of claim 15, further comprising a biasing element disposed in the cavity adjacent the cylindrical hole, the biasing element exerting a force against the cylindrical body of the lock mechanism.

19. The ejector of claim 18, wherein the biasing element comprises a cylindrical rod resting within a groove extending about a circumference of the cylindrical body of the lock mechanism.

20. The ejector of claim 19, wherein the groove includes a contoured bottom surface and the interaction between the biasing element and the contoured surface provides tactile feedback to a user actuating the lock mechanism.

21. The ejector of claim 1, wherein the release mechanism is further able to secure the ejector handle in the second position.

22. The ejector of claim 1, further comprising a hook, the hook attachable to the rack, the hook including a retaining element for interacting with a mating engagement element on the ejector handle to secure the blade in the rack when the ejector handle is at the first position.

23. The ejector of claim 22, wherein the engagement element interacts with the mating retaining element to exert an extraction force on the blade when the ejector handle is moved from the first position to the second position, and wherein the engagement element interacts with the mating retaining element to exert an insertion force on the blade when the ejector handle is moved from the second position to the first position.

24. The ejector of claim 1, further comprising a compression spring disposed between the release mechanism and the ejector handle, the compression spring to bias the release mechanism toward a position in which the release mechanism maintains the ejector handle in the first position.

25. An apparatus comprising:
a blade, wherein the blade can be disposed in a rack; and
an ejector assembly coupled with the blade, the ejector assembly including
an ejector handle rotationally coupled with the blade, the ejector handle movable between a first position wherein the blade is secured in the rack and a second position wherein the ejector handle can be removed from the rack,
a release mechanism coupled with the ejector handle, the release mechanism to secure the ejector handle in the first position and, upon actuation, to allow movement of the ejector handle toward the second position, and
a lock mechanism disposed in the ejector handle and movable between a locked position and an unlocked position, wherein the lock mechanism, when in the locked position, engages the release mechanism to prevent actuation of the release mechanism.

26. The apparatus of claim 25, further comprising a base attached to the blade, wherein the ejector handle is rotationally coupled with the base.

27. The apparatus of claim 26, wherein the ejector handle comprises:

a body rotationally coupled with the base about an axis of rotation, the body including a first lever arm extending from the axis of rotation and a second lever arm extending from the axis of rotation;
a cavity formed in the body, the cavity able to receive the release mechanism; and
an engagement element disposed on the second lever arm the engagement element to interface with a mating retaining element disposed on the rack while the ejector handle is moved between the first and second positions.

28. The apparatus of claim 27, wherein the ejector handle is movable between the first and second positions by exerting a force on the first lever arm.

29. The apparatus of claim 28, wherein the first lever arm has a length greater than a length of the second lever arm.

30. The apparatus of claim 29, wherein the first lever arm and the second lever arm are separated by an angle of approximately ninety degrees.

31. The apparatus of claim 26, wherein the release mechanism comprises:
a body rotationally coupled with the ejector handle about an axis of rotation, the body including a first lever arm extending from the axis of rotation and a second lever arm extending from the axis of rotation, the body movable between an initial position and a depressed position; and
a catch element disposed on the second lever arm, the catch element for engaging a corresponding notch on the base when the body is at the initial position, the interaction between the catch element and the notch preventing movement of the ejector handle;
wherein the release mechanism is actuated by applying a force to the first lever arm to move the body from the initial position to the depressed position, the catch element disengaging the notch when the body is at the depressed position.

32. The apparatus of claim 31, wherein the catch element engages a secondary notch on the base when the body is moved to the depressed position, the interaction between the catch element and the secondary notch holding the body at the depressed position.

33. The apparatus of claim 27, wherein the mating retaining element forms part of a hook body that is attached to the rack.

34. The apparatus of claim 33, wherein the engagement element interacts with the mating retaining element to secure the blade in the rack when the ejector handle is at the first position.

35. The apparatus of claim 34, wherein the engagement element interacts with the mating retaining element to exert an extraction force on the blade when the ejector handle is moved from the first position to the second position.

36. The apparatus of claim 35, wherein the engagement element interacts with the mating retaining element to exert an insertion force on the blade when the ejector handle is moved from the second position to the first position.

37. The apparatus of claim 25, wherein the lock mechanism comprises:
a cylindrical body disposed within a cylindrical hole in the ejector handle, the cylindrical body rotatable between the locked and unlocked positions; and
a slot disposed proximate an end of the cylindrical body and oriented parallel to an axis of the cylindrical body, the slot sized and oriented to receive a key disposed on the lock mechanism;
wherein the slot can receive the key upon actuation of the release mechanism.

38. The apparatus of claim 37, further comprising:
an indicator element disposed at an opposing end of the cylindrical body;
a first registration feature disposed on the ejector handle proximate a periphery of the cylindrical hole, wherein the first registration feature indicates, when the indicator element of the lock mechanism is aligned therewith, that the lock mechanism is in the locked position; and
a second registration feature disposed on the ejector handle proximate the periphery of the cylindrical hole, wherein the second registration feature indicates, when the indicator element of the lock mechanism is aligned therewith, that the lock mechanism is in the unlocked position.

39. The apparatus of claim 38, further comprising a drive element disposed on the opposing end of the cylindrical body, the drive element allowing a user to rotate the cylindrical body between the locked and unlocked positions.

40. The apparatus of claim 37, further comprising a biasing element disposed in the cavity adjacent the cylindrical hole, the biasing element exerting a force against the cylindrical body of the lock mechanism.

41. The apparatus of claim 40, wherein the biasing element comprises a cylindrical rod resting within a groove extending about a circumference of the cylindrical body of the lock mechanism.

42. The apparatus of claim 41, wherein the groove includes a contoured bottom surface and the interaction between the biasing element and the contoured surface provides tactile feedback to a user actuating the lock mechanism.

43. The apparatus of claim 25, wherein the release mechanism is further able to secure the ejector handle in the second position.

44. The apparatus of claim 25, further comprising a hook, the hook attachable to the rack, the hook including a retaining element for interacting with a mating engagement element on the ejector handle to secure the blade in the rack when the ejector handle is at the first position.

45. The apparatus of claim 44, wherein the engagement element interacts with the mating retaining element to exert an extraction force on the blade when the ejector handle is moved from the first position to the second position, and wherein the engagement element interacts with the mating retaining element to exert an insertion force on the blade when the ejector handle is moved from the second position to the first position.

46. The apparatus of claim 25, further comprising a compression spring disposed between the release mechanism and the ejector handle, the compression spring to bias the release mechanism toward a position in which the release mechanism maintains the ejector handle in the first position.

47. An ejector comprising:
means for ejecting a blade from a rack, the ejecting means movable between a first position wherein the blade is secured in the rack and a second position wherein the ejector handle can be removed from the rack;
means for releasing the ejecting means, the releasing means to secure the ejecting means in the first position and, upon actuation, to allow movement of the ejecting means toward the second position; and
means for locking the releasing means, the locking means movable between a locked position and an unlocked position, wherein the locking means prevents actuation of the release mechanism when in the locked position.

48. The ejector of claim 47, further comprising means for biasing the releasing means toward a position in which the releasing means maintains the ejecting means in the first position.

49. The ejector of claim 47, wherein the releasing means is further able to secure the ejecting means in the second position.

50. The ejector of claim 47, further comprising means for providing a visual indication of a status of the locking means.

51. The ejector of claim 50, further comprising means for providing tactile feedback to a user indicative of a position of the locking means.

52. The ejector of claim 47, wherein the ejecting means including means for providing a mechanical advantage.

* * * * *